US012525458B2

(12) United States Patent
Marakhtanov et al.

(10) Patent No.: US 12,525,458 B2
(45) Date of Patent: Jan. 13, 2026

(54) PLASMA UNIFORMITY CONTROL USING A PULSED MAGNETIC FIELD

(71) Applicant: Lam Research Corporation, Fremont, CA (US)

(72) Inventors: Alexei Marakhtanov, Albany, CA (US); Bing Ji, Pleasanton, CA (US); Ken Lucchesi, Newark, CA (US); John Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 402 days.

(21) Appl. No.: 18/010,453

(22) PCT Filed: Nov. 2, 2021

(86) PCT No.: PCT/US2021/057788
§ 371 (c)(1),
(2) Date: Dec. 14, 2022

(87) PCT Pub. No.: WO2022/108755
PCT Pub. Date: May 27, 2022

(65) Prior Publication Data
US 2023/0223242 A1    Jul. 13, 2023

Related U.S. Application Data

(60) Provisional application No. 63/116,752, filed on Nov. 20, 2020.

(51) Int. Cl.
*H01L 21/3065* (2006.01)
*H01J 37/32* (2006.01)

(52) U.S. Cl.
CPC .... *H01L 21/3065* (2013.01); *H01J 37/32146* (2013.01); *H01J 37/3266* (2013.01); *H01J 2237/3343* (2013.01)

(58) Field of Classification Search
CPC ............ H01L 21/3065; H01J 37/32146; H01J 37/3266; H01J 2237/3343
USPC ......................................... 156/345.1–345.55
See application file for complete search history.

(56) References Cited

U.S. PATENT DOCUMENTS

| 6,341,574 | B1* | 1/2002 | Bailey, III | .......... H01J 37/3266 118/723 MR |
| 7,095,179 | B2 | 8/2006 | Chistyakov | |
| 7,147,759 | B2 | 12/2006 | Chistyakov | |
| 7,345,429 | B2 | 3/2008 | Chistyakov | |
| 7,476,301 | B2 | 1/2009 | Weichart et al. | |

(Continued)

OTHER PUBLICATIONS

Notification of Transmittal, ISR & Written Opinion PCT/US2021/057788, dated Feb. 28, 2022.

*Primary Examiner* — Anita K Alanko
(74) *Attorney, Agent, or Firm* — PENILLA IP, APC

(57) ABSTRACT

In some implementations, a method for performing a plasma process in a chamber is provided, including: supplying a process gas to the chamber; applying pulsed RF power to the process gas in the chamber, the pulsed RF power being provided at a predefined frequency, wherein the applying of the pulsed RF power to the process gas generates a plasma in the chamber; during the applying of the RF power, applying a pulsed DC current to a magnetic coil that is disposed over the chamber, wherein the pulsed DC current is provided at the predefined frequency.

11 Claims, 10 Drawing Sheets

(56) References Cited

U.S. PATENT DOCUMENTS

| | | | |
|---|---|---|---|
| 7,645,710 B2 | 1/2010 | Olsen et al. | |
| 7,663,319 B2 | 2/2010 | Chistyakov et al. | |
| 7,678,710 B2 | 3/2010 | Chua et al. | |
| 7,808,184 B2 | 10/2010 | Chistyakov | |
| 7,837,838 B2 | 11/2010 | Chua et al. | |
| 7,898,183 B2 | 3/2011 | Chistyakov et al. | |
| 7,955,986 B2 * | 6/2011 | Hoffman | H01J 37/3244 |
| | | | 156/345.46 |
| 8,125,155 B2 | 2/2012 | Chistyakov | |
| 8,613,828 B2 | 12/2013 | Weichart et al. | |
| 9,123,508 B2 | 9/2015 | Chistyakov et al. | |
| 9,771,648 B2 * | 9/2017 | Chistyakov | H01J 37/3423 |
| 9,978,566 B2 * | 5/2018 | Yokota | H01J 37/32669 |
| 10,170,284 B2 * | 1/2019 | Yasuda | H01J 37/3266 |
| 10,271,416 B2 * | 4/2019 | Banna | H01J 37/32174 |
| 2003/0075522 A1 | 4/2003 | Weichart et al. | |
| 2004/0060813 A1 | 4/2004 | Chistyakov | |
| 2005/0103620 A1 | 5/2005 | Chistyakov | |
| 2005/0184669 A1 | 8/2005 | Chistyakov | |
| 2006/0066248 A1 | 3/2006 | Chistyakov | |
| 2006/0175197 A1 | 8/2006 | Chistyakov | |
| 2006/0279223 A1 | 12/2006 | Chistyakov | |
| 2007/0119701 A1 | 5/2007 | Chistyakov | |
| 2007/0181417 A1 | 8/2007 | Chistyakov et al. | |
| 2007/0188104 A1 | 8/2007 | Chistyakov et al. | |
| 2007/0209930 A1 | 9/2007 | Chua et al. | |
| 2007/0212895 A1 | 9/2007 | Chua et al. | |
| 2007/0212896 A1 | 9/2007 | Olsen et al. | |
| 2007/0218623 A1 | 9/2007 | Chua et al. | |
| 2009/0145554 A1 | 6/2009 | Weichart et al. | |
| 2009/0321249 A1 | 12/2009 | Chistyakov et al. | |
| 2010/0101935 A1 | 4/2010 | Chistyakov et al. | |
| 2011/0019332 A1 | 1/2011 | Chistyakov et al. | |
| 2011/0133651 A1 | 6/2011 | Chistyakov et al. | |
| 2012/0052689 A1 | 3/2012 | Tokashiki | |
| 2012/0175245 A1 | 7/2012 | Ye et al. | |
| 2014/0238844 A1 | 8/2014 | Chistyakov | |
| 2015/0315697 A1 | 11/2015 | Chistyakov et al. | |
| 2015/0315698 A1 | 11/2015 | Chistyakov | |
| 2017/0018407 A1 * | 1/2017 | Kondo | H01L 21/32136 |
| 2017/0029937 A1 | 2/2017 | Chistyakov et al. | |
| 2017/0186591 A1 * | 6/2017 | Hayashi | H01J 37/32568 |
| 2018/0044780 A1 | 2/2018 | Chistyakov et al. | |
| 2019/0368030 A1 | 12/2019 | Chistyakov | |
| 2020/0168437 A1 * | 5/2020 | Ziemba | H01J 37/32706 |
| 2020/0294768 A1 * | 9/2020 | Ohashi | H01J 37/32715 |
| 2023/0298866 A1 * | 9/2023 | Marakhtanov | H01J 37/32091 |
| | | | 438/732 |
| 2025/0079128 A1 * | 3/2025 | Chen | H01J 37/32954 |
| 2025/0095971 A1 * | 3/2025 | Lee | H01J 37/32146 |

\* cited by examiner

Negative ion front propagation during RF pulse t1- beginning of the pulse, t3-end of pulse Negative ion front propagation during RF pulse Time varying gradient of magnetic field (synced with RF pulsing frequency)

PLASMA UNIFORMITY CONTROL USING A PULSED MAGNETIC FIELD

CLAIM OF PRIORITY

This application is a national stage filing of and claims priority, under 35 U.S.C. § 371, to PCT/US21/57788, filed on Nov. 2, 2021, and titled "Plasma Uniformity Control Using a Pulsed Magnetic Field", which claims the benefit of and priority, under 35 U.S.C. § 119 (e), to U.S. Provisional Patent Application No. 63/116,752, filed on Nov. 20, 2020, and titled "Plasma Uniformity Control Using a Pulsed Magnetic Field", all of which are incorporated by reference herein in their entirety.

BACKGROUND

1. Field of the Disclosure

The present disclosure relates to semiconductor device fabrication.

2. Description of the Related Art

Plasma etching processes are often used in the manufacture of semiconductor devices on semiconductor wafers. In the plasma etching process, a semiconductor wafer that includes semiconductor devices under manufacture is exposed to a plasma generated within a plasma processing volume. The plasma interacts with material(s) on the semiconductor wafer so as to remove material(s) from the semiconductor wafer and/or modify material(s) to enable their subsequent removal from the semiconductor wafer. The plasma can be generated using specific reactant gases that will cause constituents of the plasma to interact with the material(s) to be removed/modified from the semiconductor wafer, without significantly interacting with other materials on the wafer that are not to be removed/modified. The plasma is generated by using radiofrequency signals to energize the specific reactant gases. These radiofrequency signals are transmitted through the plasma processing volume that contains the reactant gases, with the semiconductor wafer held in exposure to the plasma processing volume. The transmission paths of the radiofrequency signals through the plasma processing volume can affect how the plasma is generated within the plasma processing volume. For example, the reactant gases may be energized to a greater extent in regions of the plasma processing volume where larger amounts of radiofrequency signal power is transmitted, thereby causing spatial non-uniformities in the plasma characteristics throughout the plasma processing volume. The spatial non-uniformities in plasma characteristics can manifest as spatial non-uniformity in ion density, ion energy, and/or reactive constituent density, among other plasma characteristics. The spatial non-uniformities in plasma characteristics can correspondingly cause spatial non-uniformities in plasma processing results on the semiconductor wafer. Therefore, the manner in which radiofrequency signals are transmitted through the plasma processing volume can have an effect on the uniformity of plasma processing results on the semiconductor wafer. It is within this context that the present disclosure arises.

SUMMARY

Broadly speaking, embodiments of the present disclosure provide methods and systems for plasma uniformity control using a pulsed magnetic field.

In some implementations, a method for performing a plasma process in a chamber is provided, including: supplying a process gas to the chamber; applying pulsed RF power to the process gas to generate a plasma in the chamber, the pulsed RF power being provided at a predefined frequency; and during the applying of the pulsed RF power, applying a pulsed DC current at the predefined frequency to a magnetic coil that is disposed over the chamber.

In some implementations, each cycle of the pulsed RF power includes a first state at a first power level and a second state at a second power level less than the first power level.

In some implementations, the pulsed DC current is synchronized to the first state of the pulsed RF power, such that a current pulse to the magnetic coil is initiated substantially simultaneously with initiation of the first state of the pulsed RF power, and the current pulse to the magnetic coil is terminated substantially simultaneously with termination of the first state of the pulsed RF power.

In some implementations, a time constant of the magnetic coil substantially determines a first delay in build-up of current in the magnetic coil resulting from the initiation of the current pulse to the magnetic coil, and further substantially determines a second delay in dissipation of current in the magnetic coil resulting from the termination of the current pulse to the magnetic coil.

In some implementations, the pulsed DC current is synchronized to the second state of the pulsed RF power, such that a current pulse to the magnetic coil is initiated substantially simultaneously with initiation of the second state of the pulsed RF power, and the current pulse to the magnetic coil is terminated substantially simultaneously with termination of the second state of the pulsed RF power.

In some implementations, a time constant of the magnetic coil substantially determines a first delay in build-up of current in the magnetic coil resulting from the initiation of the current pulse to the magnetic coil, and further substantially determines a second delay in dissipation of current in the magnetic coil resulting from the termination of the current pulse to the magnetic coil.

In some implementations, applying the pulsed DC current to the magnetic coil produces a time-varying gradient of magnetic field in the plasma.

In some implementations, the time-varying gradient of magnetic field reduces localized accumulation of charged species in the plasma.

In some implementations, the reducing localized accumulation of charged species in the plasma further reduces non-uniformity of an etch process that is performed by the plasma.

In some implementations, a method for performing a plasma process in a chamber is provided, including: supplying a process gas to the chamber; applying RF power to the process gas to generate a plasma in the chamber; and during the applying of the RF power, sequentially pulsing DC current through a plurality of concentric magnetic coils disposed over the chamber, to generate a radial magnetic field wave in the chamber.

In some implementations, the radial magnetic field wave sweeps radially outward from a center region of the chamber to a peripheral region of the chamber.

In some implementations, sequentially pulsing DC current is defined by providing a DC current pulse to each of the magnetic coils consecutively in order, from an innermost magnetic coil to an outermost magnetic coil, with a time delay between initiating the DC current pulse to adjacent ones of the magnetic coils.

In some implementations, the plurality of concentric magnetic coils are substantially oriented along a same plane.

In some implementations, the sequentially pulsing DC current is cycled to repeatedly generate radial magnetic field waves in the chamber.

In some implementations, the sequentially pulsing DC current through the plurality of concentric magnetic coils includes providing pulsed DC current to each of the magnetic coils by respective power supplies.

In some implementations, the radial magnetic field wave reduces localized accumulation of charged species in the plasma.

In some implementations, the reducing localized accumulation of charged species in the plasma further reduces non-uniformity of an etch process that is performed by the plasma.

DETAILED DESCRIPTION

In the following description, numerous specific details are set forth in order to provide an understanding of embodiments of the present disclosure. It will be apparent, however, to one skilled in the art that the present disclosure may be practiced without some or all of these specific details. In other instances, well known process operations have not been described in detail in order not to unnecessarily obscure the present disclosure.

In plasma etching systems for semiconductor wafer fabrication, spatial variation of etching results across the semiconductor wafer can be characterized by radial etch uniformity and azimuthal etch uniformity. Radial etch uniformity can be characterized by the variation in etch rate as a function of radial position on the semiconductor wafer, extending outward from the center of the semiconductor wafer to the edge of the semiconductor wafer at a given azimuthal position on the semiconductor wafer. And, azimuthal etch uniformity can be characterized by the variation in etch rate as a function of azimuthal position on the semiconductor wafer, about the center of the semiconductor wafer, at a given radial position on the semiconductor wafer. In some plasma processing systems, such as in the system described herein, the semiconductor wafer is positioned on an electrode from which radiofrequency signals emanate to generate a plasma within a plasma generation region overlying the semiconductor wafer, with the plasma having characteristics controlled to cause a prescribed etching process to occur on the semiconductor wafer.

In capacitive coupled plasma (CCP) systems, there is a tendency to exhibit center plasma non-uniformity due to standing waves and localized accumulation of positive and negative ions. This results in radial non-uniformity of etch rate. For example, many CCP tools may exhibit dramatic increases in etch rate towards the center of the wafer.

Furthermore, there is tool-to-tool variation with respect to radial non-uniformity. Some tools may exhibit significant spikes in etch rate at the center, whereas other tools may not. Often this is correlated to the presence or absence of magnetic fields, as the flux from chamber parts, which may vary in configuration from tool to tool, differs. Further, the local environment or specific location of a given tool, and surrounding hardware, may affect the local magnetic fields which are present, and which in turn affect etch radial non-uniformity.

In view of the foregoing problems in existing CCP systems, some implementations of the disclosure provide for the application of a static B-field to the plasma to minimize localized charged species accumulation and improve plasma/etch uniformity across the wafer.

In some implementations, a pulsed magnetic field is applied to create a time-varying radial gradient of B-field to control radial electron diffusion, and, therefore, radial negative and positive ion acoustic waves.

Figure 1:
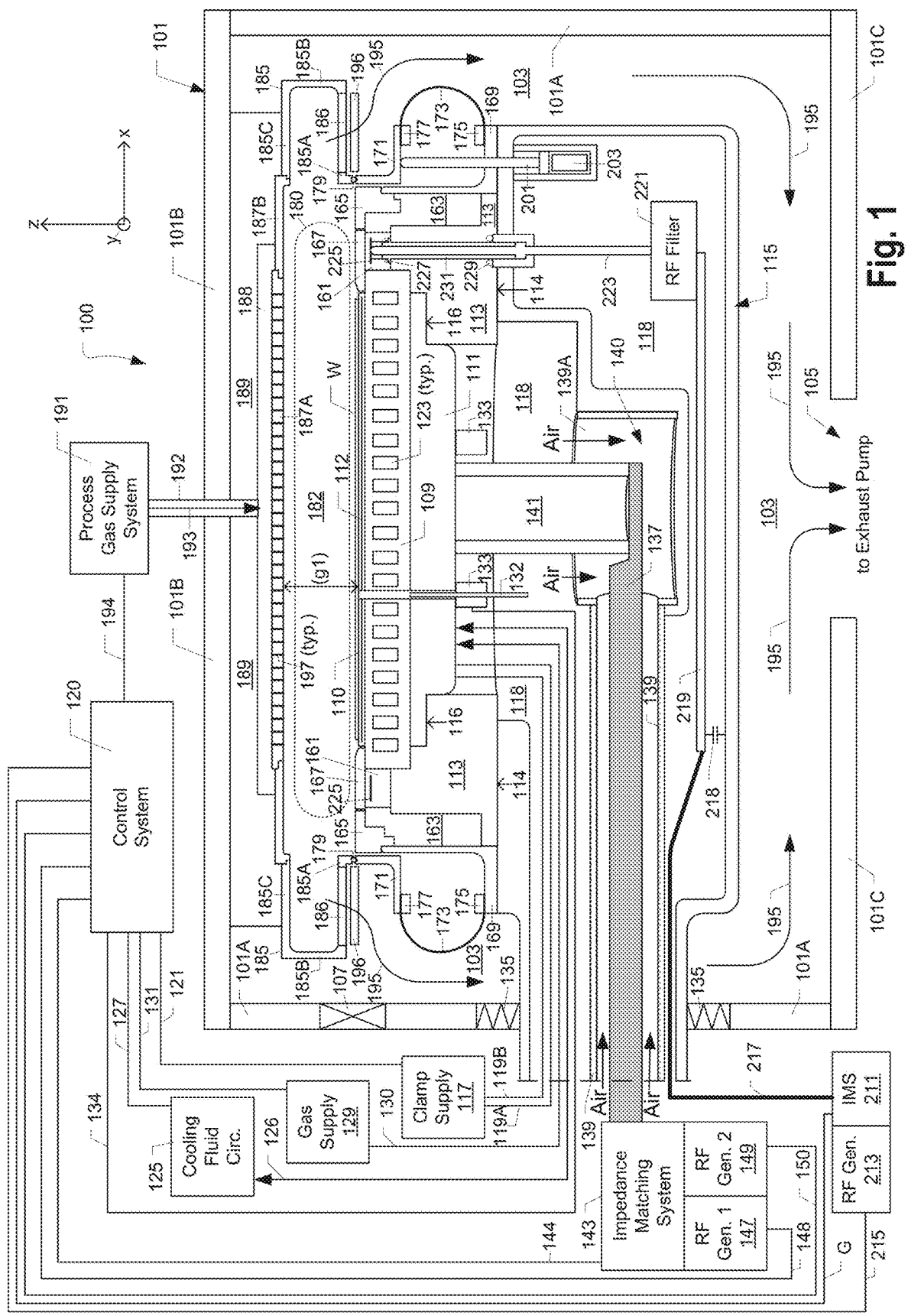
FIG. 1 shows a vertical cross-section view through a plasma processing system for use in semiconductor chip manufacturing, in accordance with some embodiments.

FIG. 1 shows a vertical cross-section view through a plasma processing system 100 for use in semiconductor chip manufacturing, in accordance with some embodiments. The system 100 includes a chamber 101 formed by walls 101A, a top member 101B, and a bottom member 101C. The walls 101A, top member 101B, and bottom member 101C collectively form an interior region 103 within the chamber 101. The bottom member 101C includes an exhaust port 105 through which exhaust gases from plasma processing operations are directed. In some embodiments, during operation, a suction force is applied at the exhaust port 105, such as by a turbo pump or other vacuum device, to draw process exhaust gases out of the interior region 103 of the chamber 101. In some embodiments, the chamber 101 is formed of aluminum. However, in various embodiments, the chamber 101 can be formed of essentially any material that provides sufficient mechanical strength, acceptable thermal performance, and is chemically compatible with the other materials to which it interfaces and to which it is exposed during plasma processing operations within the chamber 101, such as stainless steel, among others. At least one wall 101A of the chamber 101 includes a door 107 through which a semiconductor wafer W is transferred into and out of the chamber 101. In some embodiments, the door 107 is configured as a slit-valve door.

In some embodiments, the semiconductor wafer W is a semiconductor wafer undergoing a fabrication procedure. For ease of discussion, the semiconductor wafer W is referred to as wafer W hereafter. However, it should be understood that in various embodiments, the wafer W can be essentially any type of substrate that is subjected to a plasma-based fabrication process. For example, in some embodiments, the wafer W as referred to herein can be a substrate formed of silicon, sapphire, GaN, GaAs or SiC, or other substrate materials, and can include glass panels/substrates, metal foils, metal sheets, polymer materials, or the like. Also, in various embodiments, the wafer W as referred to herein may vary in form, shape, and/or size. For example, in some embodiments, the wafer W referred to herein may correspond to a circular-shaped semiconductor wafer on which integrated circuit devices are manufactured. In various embodiments, the circular-shaped wafer W can have a diameter of 200 mm (millimeters), 300 mm, 450 mm, or of another size. Also, in some embodiments, the wafer W referred to herein may correspond to a non-circular substrate, such as a rectangular substrate for a flat panel display, or the like, among other shapes.

The plasma processing system 100 includes an electrode 109 positioned on a facilities plate 111. In some embodiments, the electrode 109 and the facilities plate 111 are formed of aluminum. However, in other embodiments, the electrode 109 and the facilities plate 111 can be formed of another electrically conductive material that has sufficient mechanical strength and that has compatible thermal and chemical performance characteristics. A ceramic layer 110 is formed on a top surface of the electrode 109. The ceramic layer 110 is configured to receive and support the wafer W during performance of plasma processing operations on the wafer W. In some embodiments, the top surface of the electrode 190 that is located radially outside of the ceramic layer 110 and the peripheral side surfaces of the electrode 109 are covered with a spray coat of ceramic.

The ceramic layer 110 includes an arrangement of one or more clamp electrodes 112 for generating an electrostatic force to hold the wafer W to the top surface of the ceramic layer 110. In some embodiments, the ceramic layer 110 includes an arrangement of two clamp electrodes 112 that operate in a bipolar manner to provide a clamping force to the wafer W. The clamp electrodes 112 are connected to a direct current (DC) supply 117 that generates a controlled clamping voltage to hold the wafer W against the top surface of the ceramic layer 110. Electrical wires 119A, 119B are connected between the DC supply 117 and the facilities plate 111. Electrical wires/conductors are routed through the facilities plate 111 and the electrode 109 to electrically connect the wires 119A, 119B to the clamp electrodes 112. The DC supply 117 is connected to a control system 120 through one or more signal conductors 121.

The electrode 109 also includes an arrangement of temperature control fluid channels 123 through which a temperature control fluid is flowed to control a temperature of the electrode 109 and in turn control a temperature of the wafer W. The temperature control fluid channels 123 are plumbed (fluidly connected) to ports on the facilities plate 111. Temperature control fluid supply and return lines are connected to these ports on the facilities plate 111 and to a temperature control fluid circulation system 125, as indicated by arrow 126. The temperature control fluid circulation system 125 includes a temperature control fluid supply, a temperature control fluid pump, and a heat exchanger, among other devices, to provide a controlled flow of temperature control fluid through the electrode 109 in order to obtain and maintain a prescribed wafer W temperature. The temperature control fluid circulation system 125 is connected to the control system 120 through one or more signal conductors 127. In various embodiments, various types of temperature control fluid can be used, such as water or a refrigerant liquid/gas. Also, in some embodiments, the temperature control fluid channels 123 are configured to enable spatially varying control of the temperature of the wafer W, such as in two dimensions (x and y) across the wafer W.

The ceramic layer 110 also includes an arrangement of backside gas supply ports (not shown) that are fluidly connected to corresponding backside gas supply channels within the electrode 109. The backside gas supply channels within the electrode 109 are routed through the electrode 109 to the interface between the electrode 109 and the facilities plate 111. One or more backside gas supply line(s) are connected to ports on the facilities plate 111 and to a backside gas supply system 129, as indicated by arrow 130. The facilities plate 111 is configured to supply the backside gas(es) from the one or more backside gas supply line(s) to the backside gas supply channels within the electrode 109. The backside gas supply system 129 includes a backside gas supply, a mass flow controller, and a flow control valve, among other devices, to provide a controlled flow of backside gas through the arrangement of backside gas supply ports in the ceramic layer 110. In some embodiments, the backside gas supply system 129 also includes one or more components for controlling a temperature of the backside gas. In some embodiments, the backside gas is helium. Also, in some embodiments, the backside gas supply system 129 can be used to supply compressed dry air (CDA) to the arrangement of backside gas supply ports in the ceramic layer 110. The backside gas supply system 129 is connected to the control system 120 through one or more signal conductors 131.

Three lift pins 132 extend through the facilities plate 111, the electrode 109, and the ceramic layer 110 to provide for vertical movement of the wafer W relative to the top surface of the ceramic layer 110. In some embodiments, vertical movement of the lift pins 132 is controlled by a respective electromechanical and/or pneumatic lifting device 133 connected to the facilities plate 111. The three lifting devices 133 are connected to the control system 120 through one or more signal conductors 134. In some embodiments, the three lift pins 132 are positioned to have a substantially equal azimuthal spacing about a vertical centerline of the electrode 109/ceramic layer 110 that extends perpendicular to the top surface of the ceramic layer 110. It should be understood that the lift pins 132 are raised to receive the wafer W into the chamber 101 and to remove the wafer W from the chamber 101. Also, the lift pins 132 are lowered to allow the wafer W to rest on the top surface of the ceramic layer 110 during processing of the wafer W.

Also, in various embodiments, one or more of the electrode 109, the facilities plate 111, the ceramic layer 110, the clamp electrodes 112, the lift pins 132, or essentially any other component associated therewith can be equipped to include one or more sensors, such as sensors for temperature measurement, electrical voltage measurement, and electrical current measurement, among others. Any sensor disposed within the electrode 109, the facilities plate 111, the ceramic layer 110, the clamp electrodes 112, the lift pins 132, or essentially any other component associated therewith is connected to the control system 120 by way of electrical wire, optical fiber, or through a wireless connection.

The facilities plate 111 is set within an opening of a ceramic support 113, and is supported by the ceramic support 113. The ceramic support 113 is positioned on a supporting surface 114 of a cantilever arm assembly 115. In some embodiments, the ceramic support 113 has a substantially annular shape, such that the ceramic support 113 substantially circumscribes the outer radial perimeter of the facilities plate 111, while also providing a supporting surface 116 upon which a bottom outer peripheral surface of the facilities plate 111 rests. The cantilever arm assembly 115 extends through the wall 101A of the chamber 101. In some embodiments, a sealing mechanism 135 is provided within the wall 101A of the chamber 101 where the cantilever arm assembly 115 is located to provide for sealing of the interior region 103 of the chamber 101, while also enabling the cantilever arm assembly 115 to move upward and downward in the z-direction in a controlled manner The cantilever arm assembly 115 has an open region 118 through which various devices, wires, cables, and tubing is routed to support operations of the system 100. The open region 118 within the cantilever arm assembly is exposed to ambient atmospheric conditions outside of the chamber 101, e.g. air composition, temperature, pressure, and relative humidity. Also, a radiofrequency signal supply rod 137 is positioned inside of the cantilever arm assembly 115. More specifically, the radiofrequency signal supply rod 137 is positioned inside of an electrically conductive tube 139, such that the radiofrequency signal supply rod 137 is spaced apart from the inner wall of the tube 139. The sizes of the radiofrequency signal supply rod 137 and the tube 139 may vary. The region inside of the tube 139 between the inner wall of the tube 139 and the radiofrequency signal supply rod 137 is occupied by air along the full length of the tube 139.

In some embodiments, the radiofrequency signal supply rod 137 is substantially centered within the tube 139, such that a substantially uniform radial thickness of air exists between the radiofrequency signal supply rod 137 and the inner wall of the tube 139, along the length of tube 139. However, in some embodiments, the radiofrequency signal supply rod 137 is not centered within the tube 139, but the air gap within the tube 139 exists at all locations between the radiofrequency signal supply rod 137 and the inner wall of the tube 139, along the length of the tube 139. A delivery end of the radiofrequency signal supply rod 137 is electrically and physically connected to a lower end of a radiofrequency signal supply shaft 141. In some embodiments, the delivery end of the radiofrequency signal supply rod 137 is bolted to a lower end of a radiofrequency signal supply shaft 141. An upper end of the radiofrequency signal supply shaft 141 is electrically and physically connected to the bottom of the facilities plate 111. In some embodiments, the upper end of the radiofrequency signal supply shaft 141 is bolted to the bottom of the facilities plate 111. In some embodiments, both the radiofrequency signal supply rod 137 and the radiofrequency signal supply shaft 141 are formed of copper. In some embodiments, the radiofrequency signal supply rod 137 is formed of copper, or aluminum, or anodized aluminum. In some embodiments, the radiofrequency signal supply shaft 141 is formed of copper, or aluminum, or anodized aluminum. In other embodiments, the radiofrequency signal supply rod 137 and/or the radiofrequency signal supply shaft 141 is formed of another electrically conductive material that provides for transmission of radiofrequency electrical signals. In some embodiments, the radiofrequency signal supply rod 137 and/or the radiofrequency signal supply shaft 141 is coated with an electrically conductive material (such as silver or another electrically conductive material) that provides for transmission of radiofrequency electrical signals. Also, in some embodiments, the radiofrequency signal supply rod 137 is a solid rod. However, in other embodiments, the radiofrequency signal supply rod 137 is a tube. Also, it should be understood that a region 140 surrounding the connection between the radiofrequency signal supply rod 137 and the radiofrequency signal supply shaft 141 is occupied by air.

A supply end of the radiofrequency signal supply rod 137 is connected electrically and physically to an impedance matching system 143. The impedance matching system 143 is connected to a first radiofrequency signal generator 147 and a second radiofrequency signal generator 149. The impedance matching system 143 is also connected to the control system 120 through one or more signal conductors 144. The first radiofrequency signal generator 147 is also connected to the control system 120 through one or more signal conductors 148. The second radiofrequency signal generator 149 is also connected to the control system 120 through one or more signal conductors 150. The impedance matching system 143 includes an arrangement of inductors and capacitors sized and connected to provide for impedance matching so that radiofrequency power can be transmitted along the radiofrequency signal supply rod 137, along the radiofrequency signal supply shaft 141, through the facilities plate 111, through the electrode 109, and into a plasma processing region 182 above the ceramic layer 110. In some embodiments, the first radiofrequency signal generator 147 is a high frequency radiofrequency signal generator, and the second radiofrequency signal generator 149 is a low frequency radiofrequency signal generator. In some embodiments, the first radiofrequency signal generator 147 generates radiofrequency signals within a range extending from about 50 MegaHertz (MHz) to about 70 MHz, or within a range extending from about 54 MHz to about 63 MHz, or at about 60 MHz. In some embodiments, the first radiofrequency signal generator 147 supplies radiofrequency power within a range extending from about 5 kiloWatts (kW) to about 25 kW, or within a range extending from about 10 kW to about 20 kW, or within a range extending from about 15 kW to about 20 kW, or of about 10 kW, or of about 16 kW. In some embodiments, the second radiofrequency signal generator 149 generates radiofrequency signals within a range extending from about 50 kiloHertz (kHz) to about 500 kHz, or within a range extending from about 330 kHz to about 440 kHz, or at about 400 kHz. In some embodiments, the second radiofrequency signal generator 149 supplies radiofrequency power within a range extending from about 15 kW to about 100 kW, or within a range extending from about 30 kW to about 50 kW, or of about 34 kW, or of about 50 kW. In an example embodiment, the first radiofrequency signal generator 147 is set to generate radiofrequency signals having a frequency of about 60 MHz, and the second radiofrequency signal generator 149 is set to generate radiofrequency signals having a frequency of about 400 kHz.

A coupling ring 161 is configured and positioned to extend around the outer radial perimeter of the electrode 109. In some embodiments, the coupling ring 161 is formed of a ceramic material. A quartz ring 163 is configured and positioned to extend around the outer radial perimeters of both the coupling ring 161 and the ceramic support 113. In some embodiments, the coupling ring 161 and the quartz ring 163 are configured to have substantially aligned top surfaces when the quartz ring 163 is positioned around both the coupling ring 161 and the ceramic support 113. Also, in some embodiments, the substantially aligned top surfaces of the coupling ring 161 and the quartz ring 163 are substantially aligned with a top surface of the electrode 109, said top surface being present outside of the radial perimeter of the ceramic layer 110. Also, in some embodiments, a cover ring 165 is configured and positioned to extend around the outer radial perimeter of the top surface of the quartz ring 163. In some embodiments, the cover ring 165 is formed of quartz. In some embodiments, the cover ring 165 is configured to extend vertically above the top surface of the quartz ring 163. In this manner, the cover ring 165 provides a peripheral boundary within which an edge ring 167 is positioned.

The edge ring 167 is configured to facilitate extension of the plasma sheath radially outward beyond the peripheral edge of the wafer W to provide improvement in process results near the periphery of the wafer W. In various embodiments, the edge ring 167 is formed of a conductive material, such as crystalline silicon, polycrystalline silicon (polysilicon), boron doped single crystalline silicon, aluminum oxide, quartz, aluminum nitride, silicon nitride, silicon carbide, or a silicon carbide layer on top of an aluminum oxide layer, or an alloy of silicon, or a combination thereof, among other materials. It should be understood that the edge ring 167 is formed as an annular-shaped structure, e.g. as a ring-shaped structure. The edge ring 167 can perform many functions, including shielding components underlying the edge ring 167 from being damaged by ions of a plasma 180 formed within a plasma processing region 182. Also, the edge ring 167 improves uniformity of the plasma 180 at and along the outer peripheral region of the wafer W.

A fixed outer support flange 169 is attached to the cantilever arm assembly 115. The fixed outer support flange 169 is configured to extend around an outer vertical side surface of the ceramic support 113, and around an outer vertical side surface of the quartz ring 163, and around a lower outer vertical side surface of the cover ring 165. The fixed outer support flange 169 has an annular shape that circumscribes the assembly of the ceramic support 113, the quartz ring 163, and the cover ring 165. The fixed outer support flange 169 has an L-shaped vertical cross-section that includes a vertical portion and a horizontal portion. The vertical portion of the L-shaped cross-section of the fixed outer support flange 169 has an inner vertical surface that is positioned against the outer vertical side surface of the ceramic support 113, and against the outer vertical side surface of the quartz ring 163, and against the lower outer vertical side surface of the cover ring 165. In some embodiments, the vertical portion of the L-shaped cross-section of the fixed outer support flange 169 extends over an entirety of the outer vertical side surface of the ceramic support 113, and over an entirety of the outer vertical side surface of the quartz ring 163, and over the lower outer vertical side surface of the cover ring 165. In some embodiments, the cover ring 165 extends radially outward above a top surface of the vertical portion of the L-shaped cross-section of the fixed outer support flange 169. And, in some embodiments, an upper outer vertical side surface of the cover ring 165 (located above the top surface of the vertical portion of the L-shaped cross-section of the fixed outer support flange 169) is substantially vertically aligned with an outer vertical surface of the vertical portion of the L-shaped cross-section of the fixed outer support flange 169. The horizontal portion of the L-shaped cross-section of the fixed outer support flange 169 is positioned on and fastened to the supporting surface 114 of a cantilever arm assembly 115. The fixed outer support flange 169 is formed of an electrically conductive material. In some embodiments, the fixed outer support flange 169 is formed of aluminum or anodized aluminum. However, in other embodiments, the fixed outer support flange 169 can be formed of another electrically conductive material, such as copper or stainless steel. In some embodiments, the horizontal portion of the L-shaped cross-section of the fixed outer support flange 169 is bolted to the supporting surface 114 of a cantilever arm assembly 115.

An articulating outer support flange 171 is configured and positioned to extend around the outer vertical surface 169D of the vertical portion of the L-shaped cross-section of the fixed outer support flange 169, and to extend around the upper outer vertical side surface of the cover ring 165. The articulating outer support flange 171 has an annular shape that circumscribes both the vertical portion of the L-shaped vertical cross-section of the fixed outer support flange 169 and the upper outer vertical side surface of the cover ring 165. The articulating outer support flange 171 has an L-shaped vertical cross-section that includes a vertical portion and a horizontal portion. The vertical portion of the L-shaped cross-section of the articulating outer support flange 171 has an inner vertical surface that is positioned proximate to and spaced apart from both the outer vertical side surface of the vertical portion of the L-shaped cross-section of the fixed outer support flange 169 and the upper outer vertical side surface of the cover ring 165. In this manner, the articulating outer support flange 171 is moveable in the vertical direction (z-direction) along both the vertical portion of the L-shaped vertical cross-section of the fixed outer support flange 169 and the upper outer vertical side surface of the cover ring 165. The articulating outer support flange 171 is formed of an electrically conductive material. In some embodiments, the articulating outer support flange 171 is formed of aluminum or anodized aluminum. However, in other embodiments, the articulating outer support flange 171 can be formed of another electrically conductive material, such as copper or stainless steel.

A number of electrically conductive straps 173 are connected between the articulating outer support flange 171 and the fixed outer support flange 169, around the outer radial perimeters of both the articulating outer support flange 171 and the fixed outer support flange 169. In the example embodiment, the electrically conductive straps 173 are shown to have an "outward" configuration, in that the electrically conductive straps 173 bend outward away from the fixed outer support flange 169. In some embodiments, the electrically conductive straps 173 are formed of stainless steel. However, in other embodiments, the electrically conductive straps 173 can be formed of another electrically conductive material, such as aluminum or copper, among others.

In some embodiments, forty-eight (48) electrically conductive straps 173 are distributed in a substantially equally spaced manner around the outer radial perimeters of the articulating outer support flange 171 and the fixed outer support flange 169. It should be understood, however, that the number of electrically conductive straps 173 can vary in different embodiments. In some embodiments, the number of electrically conductive straps 173 is within a range extending from about 24 to about 80, or within a range extending from about 36 to about 60, or within a range extending from about 40 to about 56. In some embodiments, the number of electrically conductive straps 173 is less than 24. In some embodiments, the number of electrically conductive straps 173 is greater than 80. Because the number of electrically conductive straps 173 has an effect on the ground return paths for the radiofrequency signals around the perimeter of the plasma processing region 182, the number of electrically conductive straps 173 can have an effect on the uniformity of process results across the wafer W. Also, the size of the electrically conductive straps 173 can vary in different embodiments.

In some embodiments, the electrically conductive straps 173 are connected to the fixed outer support flange 169 by a clamping force applied by securing a clamp ring 175 to a top surface of the horizontal portion of the L-shaped cross-section of the fixed outer support flange 169. In some embodiments, the clamp ring 175 is bolted to the fixed outer support flange 169. In some embodiments, the bolts that secure the clamp ring 175 to the fixed outer support flange 169 are positioned at locations between the electrically conductive straps 173. However, in some embodiments, one or more bolts that secure the clamp ring 175 to the fixed outer support flange 169 can be positioned to extend through electrically conductive straps 173. In some embodiments, the clamp ring 175 is formed of a same material as the fixed outer support flange 169. However, in other embodiments, the clamp ring 175 and the fixed outer support flange 169 can be formed of different materials.

In some embodiments, the electrically conductive straps 173 are connected to the articulating outer support flange 171 by a clamping force applied by securing a clamp ring 177 to a bottom surface of the horizontal portion of the L-shaped cross-section of the articulating outer support flange 171. Alternatively, in some embodiments, the first end portion of each of the plurality of electrically conductive straps 173 is connected to the upper surface of the horizontal portion of the articulating outer support flange 171 by the clamp ring 177. In some embodiments, the clamp ring 177 is bolted to the articulating outer support flange 171. In some embodiments, the bolts that secure the clamp ring 177 to the articulating outer support flange 171 are positioned at locations between the electrically conductive straps 173. However, in some embodiments, one or more bolts that secure the clamp ring 177 to the articulating outer support flange 171 can be positioned to extend through electrically conductive straps 173. In some embodiments, the clamp ring 177 is formed of a same material as the articulating outer support flange 171. However, in other embodiments, the clamp ring 177 and the articulating outer support flange 171 can be formed of different materials.

A set of support rods 201 are positioned around the cantilever arm assembly 115 to extend vertically through the horizontal portion 169B of the L-shaped cross-section of the fixed outer support flange 169. The upper end of the support rods 201 are configured to engage with the bottom surface of the horizontal portion of the L-shaped cross-section of the articulating outer support flange 171. In some embodiments, a lower end of each of the support rods 201 is engaged with a resistance mechanism 203. The resistance mechanism 203 is configured to provide an upward force to the corresponding support rod 201 that will resist downward movement of the support rod 201, while allowing some downward movement of the support rod 201. In some embodiments, the resistance mechanism 203 includes a spring to provide the upward force to the corresponding support rod 201. In some embodiments, the resistance mechanism 203 includes a material, e.g. spring and/or rubber, that has a sufficient spring constant to provide the upward force to the corresponding support rod 201. It should be understood that as the articulating outer support flange 171 moves downward to engage the set of support rods 201, the set of support rods 201 and corresponding resistance mechanisms 203 provide an upward force to the articulating outer support flange 171. In some embodiments, the set of support rods 201 includes three support rods 201 and corresponding resistance mechanisms 203. In some embodiments, the support rods 201 are positioned to have a substantially equal azimuthal spacing relative to a vertical centerline of the electrode 109. However, in other embodiments, the support rods 201 are positioned to have a non-equal azimuthal spacing relative to a vertical centerline of the electrode 109. Also, in some embodiments, more than three support rods 201 and corresponding resistance mechanisms 203 are provided to support the articulating outer support flange 171.

With continued reference back FIG. 1, the plasma processing system 100 further includes a C-shroud member 185 positioned above the electrode 109. The C-shroud member 185 is configured to interface with the articulating outer support flange 171. Specifically, a seal 179 is disposed on the top surface of the horizontal portion of the L-shaped cross-section of the articulating outer support flange 171, such that the seal 179 is engaged by the C-shroud member 185 when the articulating outer support flange 171 is moved upward toward the C-shroud member 185. In some embodiments, the seal 179 is electrically conductive to assist with establishing electrical conduction between the C-shroud member 185 and the articulating outer support flange 171. In some embodiments, the C-shroud member 185 is formed of polysilicon. However, in other embodiments, the C-shroud member 185 is formed of another type of electrically conductive material that is chemically compatible with the processes to be formed in the plasma processing region 182, and that has sufficient mechanical strength.

The C-shroud is configured to extend around the plasma processing region 182 and provide a radial extension of the plasma processing region 182 volume into the region defined within the C-shroud member 185. The C-shroud member 185 includes a lower wall 185A, an outer vertical wall 185B, and an upper wall 185C. In some embodiments, the outer vertical wall 185B and the upper wall 185C of the C-shroud member 185 are solid, non-perforated members, and the lower wall 185A of the C-shroud member 185 includes a number of vents 186 through which process gases flow from within the plasma processing region 182. In some embodiments, a throttle member 196 is disposed below the vents 186 of the C-shroud member 185 to control a flow of process gas through the vents 186. More specifically, in some embodiments, the throttle member 196 is configured to move up and down vertically in the z-direction relative to the C-shroud member 185 to control the flow of process gas through the vents 186. In some embodiments, the throttle member 196 is configured to engage with and/or enter the vents 186.

The upper wall 185C of the C-shroud member 185 is configured to support an upper electrode 187A/187B. In some embodiments, the upper electrode 187A/187B includes an inner upper electrode 187A and an outer upper electrode 187B. Alternatively, in some embodiments, the inner upper electrode 187A is present and the outer upper electrode 187B is not present, with the inner upper electrode 187A extending radially to cover the location that would be occupied by the outer upper electrode 187B. In some embodiments, the inner upper electrode 187A is formed of single crystal silicon and the outer upper electrode 187B is formed of polysilicon. However, in other embodiments, the inner upper electrode 187A and the outer upper electrode 187B can be formed of other materials that are structurally, chemically, electrically, and mechanically compatible with the processes to be performed within the plasma processing region 182. The inner upper electrode 187A includes a number of throughports 197 defined as holes extending through an entire vertical thickness of the inner upper electrode 187A. The throughports 197 are distributed across the inner upper electrode 187A, relative to the x-y plane, to provide for flow of process gas(es) from a plenum region 188 above the upper electrode 187A/187B to the plasma processing region 182 below the upper electrode 187A/187B.

It should be understood that the distribution of throughports 197 across the inner upper electrode 187A can be configured in different ways for different embodiments. For example, a total number of throughports 197 within the inner upper electrode 187A and/or a spatial distribution of throughports 197 within the inner upper electrode 187A can vary between different embodiments. Also, a diameter of the throughports 197 can vary between different embodiments. In general, it is of interest to reduce the diameter of the throughports 197 to a size small enough to prevent intrusion of the plasma 180 into the throughports 197 from the plasma processing region 182. In some embodiments, as the diameter of the throughports 197 is reduced, the total number of throughports 197 within the inner upper electrode 187A is increased to maintain a prescribed overall flowrate of process gas(es) from the process gas plenum region 188 through the inner upper electrode 187A to the plasma processing region 182. Also, in some embodiments, the upper electrode 187A/187B is electrically connected to a reference ground potential. However, in other embodiments, the inner upper electrode 187A and/or the outer upper electrode 187B is/are electrically connected to either a respective direct current (DC) electrical supply or a respective radiofrequency power supply by way of a corresponding impedance matching circuit.

The plenum region 188 is defined by an upper member 189. One or more gas supply ports 192 are formed through the chamber 101 and the upper member 189 to be in fluid communication with the plenum region 188. The one or more gas supply ports 192 are fluidly connected (plumbed) to a process gas supply system 191. The process gas supply system 191 includes one or process gas supplies, one or more mass flow controller(s), one or more flow control valve(s), among other devices, to provide controlled flow of one or more process gas(es) through the one or more gas supply ports 192 to the plenum region 188, as indicated by arrow 193. In some embodiments, the process gas supply system 191 also includes one or more components for controlling a temperature of the process gas(es). The process gas supply system 191 is connected to the control system 120 through one or more signal conductors 194.

A processing gap (g1) is defined as the vertical (z-direction) distance as measured between the top surface of the ceramic layer 110 and the bottom surface of the inner upper electrode 187A. The size of the processing gap (g1) can be adjusted by moving the cantilever arm assembly 115 in the vertical direction (z-direction). As the cantilever arm assembly 115 moves upward, the articulating outer support flange 171 eventually engages the lower wall 185A of the C-shroud member 185, at which point the articulating outer support flange 171 moves along the fixed outer support flange 169 as the cantilever arm assembly 115 continues to move upward until the set of support rods 201 engage the articulating outer support flange 171 and the prescribed processing gap (g1) size is achieved. Then, to reverse this movement for removal of the wafer W from the chamber, the cantilever arm assembly 115 is moved downward until the articulating outer support flange 171 moves away from the lower wall 185A of the C-shroud member 185. It should be understood that FIG. 1 shows the system 100 in a closed configuration with the wafer W position on the ceramic layer 110 for plasma processing.

During plasma processing operations within the plasma processing system 100, the one or more process gas(es) are supplied to the plasma processing region 182 by way of the process gas supply system 191, plenum region 188, and throughports 197 within the inner upper electrode 187A. Also, radiofrequency signals are transmitted into the plasma processing region 182, by way of the first and second radiofrequency signal generators 147, 149, the impedance matching system 143, the radiofrequency signal supply rod 137, the radiofrequency signal supply shaft 141, the facilities plate 111, the electrode 109, and through the ceramic layer 110. The radiofrequency signals transform the process gas(es) into the plasma 180 within the plasma processing region 182. Ions and/or reactive constituents of the plasma interact with one or more materials on the wafer W to cause a change in composition and/or shape of particular material(s) present on the wafer W. The exhaust gases from the plasma processing region 182 flow through the vents 186 in the C-shroud member 185 and through the interior region 103 within the chamber 101 to the exhaust port 105 under the influence of a suction force applied at the exhaust port 105, as indicated by arrows 195.

In various embodiments, the electrode 109 can be configured to have different diameters. However, in some embodiments, to increase the surface of the electrode 109 upon which the edge ring 167 rests, the diameter of the electrode 109 is extended. In some embodiments, an electrically conductive gel 226 is disposed between a bottom of the edge ring 167 and the top of the electrode 109 and/or between the bottom of the edge ring 167 and the top of the coupling ring 161. In these embodiments, the increased diameter of the electrode 109 provides more surface area upon which the conductive gel is disposed between the edge ring 167 and the electrode 109.

It should be understood that the combination of the articulating outer support flange 171, the electrically conductive straps 173, and the fixed outer support flange 169 are electrically at a reference ground potential, and collectively form a ground return path for radiofrequency signals transmitted from the electrode 109 through the ceramic layer 110 into the plasma processing region 182. The azimuthal uniformity of this ground return path around the perimeter of the electrode 109 can have an effect on uniformity of process results on the wafer W. For example, in some embodiments, the uniformity of etch rate across the wafer W can be affected by the azimuthal uniformity of the ground return path around the perimeter of the electrode 109. To this end, it should be understood that the number, configuration, and arrangement of the electrically conductive straps 173 around the perimeter of the electrode 109 can affect the uniformity of process results across the wafer W.

With reference back to FIG. 1, a Tunable Edge Sheath (TES) system is implemented to include a TES electrode 225 disposed (embedded) within the coupling ring 161. The TES system also includes a number of TES radiofrequency signal supply pins 223 in physical and electrical connection with the TES electrode 225. Each TES radiofrequency signal supply pin 223 extends through a corresponding insulator feedthrough member 231 configured to electrically separate the TES radiofrequency signal supply pin 223 from surrounding structures, such as from the ceramic support 113 and the cantilever arm assembly 115 structure. In some embodiments, o-rings 227 and 229 are disposed to ensure that the region inside of the insulator feedthrough member 231 is not exposed to any materials/gases present within the plasma processing region 182. In some embodiments, the TES radiofrequency signal supply pins 223 are formed of copper, or aluminum, or anodized aluminum, among others.

The TES radiofrequency signal supply pins 223 extend into the open region 118 inside of the cantilever arm assembly 115, where each of the TES radiofrequency signal supply pins 223 is electrically connected to a TES radiofrequency signal supply conductor 219 through a corresponding TES radiofrequency signal filter 221. In some embodiments, three TES radiofrequency signal supply pins 223 are positioned to physically and electrically connect with the TES electrode 225 at substantially equally spaced azimuthal locations about the centerline of the electrode 109. It should be understood, however, that other embodiments can have more than three TES radiofrequency signal supply pins 223 in physical and electrical connection with the TES electrode 225. Also, some embodiments can have either one or two TES radiofrequency signal supply pins 223 in physical and electrical connection with the TES electrode 225. Each TES radiofrequency signal supply pin 223 is electrically connected to a corresponding TES radiofrequency signal filter 221, with each TES radiofrequency signal filter 221 electrically connected to the TES radiofrequency signal supply conductor 219. In some embodiments, each TES radiofrequency signal filter 221 is configured as an inductor. For example, in some embodiments, each TES radiofrequency signal filter 221 is configured as a coiled conductor, such as a metal coil wrapped around a dielectric core structure. In various embodiments, the metal coil can be formed of solid copper rod, copper tubing, aluminum rod, or aluminum tubing, among others. Also, in some embodiments, each TES radiofrequency signal filter 221 can be configured as a combination of inductive and capacitive structures. In the interest of improving plasma processing result uniformity across the wafer W, each of the TES radiofrequency signal filters 221 has a substantially same configuration.

In some embodiments, the TES radiofrequency signal supply conductor 219 is formed as a ring-shaped (annular-shaped) structure, so as to extend around the open region 118 inside of the cantilever arm assembly 115 to enable physical and electrical connection of the azimuthally distributed TES radiofrequency signal filters 221 with the TES radiofrequency signal supply conductor 219. In some embodiments, the TES radiofrequency signal supply conductor 219 is formed as a solid (non-tubular) structure. Alternatively, in some embodiments, the TES radiofrequency signal supply conductor 219 is formed as a tubular structure. In some embodiments, the TES radiofrequency signal supply conductor 219 is formed of copper, or aluminum, or anodized aluminum, among others.

The TES radiofrequency signal supply conductor 219 is electrically connected to a TES radiofrequency supply cable 217. Also, a capacitor 218 is connected between the TES radiofrequency signal supply conductor 219 and a reference ground potential, such as the structure of the cantilever arm assembly 115. More specifically, the capacitor 218 has a first terminal electrically connected to both the TES radiofrequency supply cable 217 and the TES radiofrequency signal supply conductor 219, and the capacitor 218 has a second terminal electrically connected to the reference ground potential. In some embodiments, the capacitor 218 is a variable capacitor. In some embodiments, the capacitor 218 is a fixed capacitor. In some embodiments, the capacitor 218 is set to have a capacitance within a range extending from about 10 picoFarads to about 100 picoFarads. The TES radiofrequency supply cable 217 is connected to a TES impedance matching system 211. The TES impedance matching system 211 is connected to a TES radiofrequency signal generator 213. Radiofrequency signals generated by the TES radiofrequency signal generator 213 are transmitted through the TES impedance matching system 211 to the TES radiofrequency supply cable 217, then to the TES radiofrequency signal supply conductor 219, then through the TES radiofrequency signal filters 221 to the respective TES radiofrequency signal supply pins 223, and to the TES electrode 225 within the coupling ring 161. In some embodiments, the TES radiofrequency signal generator 213 is configured and operated to generate radiofrequency signals within a frequency range extending from about 50 kiloHertz to about 27 MHz. In some embodiments, the TES radiofrequency signal generator 213 supplies radiofrequency power within a range extending from about 50 Watts to about 10 kiloWatts. The TES radiofrequency signal generator 213 is also connected to the control system 120 through one or more signal conductors 215.

The TES impedance matching system 211 includes an arrangement of inductors and capacitors sized and connected to provide for impedance matching so that radiofrequency power can be transmitted from the TES radiofrequency signal generator 213 along the TES radiofrequency supply cable 217, along the TES radiofrequency signal supply conductor 219, through the TES radiofrequency signal filters 221, through the respective TES radiofrequency signal supply pins 223, to the TES electrode 225 within the coupling ring 161, and into the plasma processing region 182 above the edge ring 167. The TES impedance matching system 211 is also connected to the control system 120 through one or more signal conductors 214.

By transmitting radiofrequency signals/power through the TES electrode 225 disposed (embedded) within the coupling ring 161, the TES system is capable of controlling characteristics of the plasma 180 near the peripheral edge of the wafer W. For example, in some embodiments, the TES system is operated to control the plasma 180 sheath properties near the edge ring 167, such as by controlling a shape of the plasma 180 sheath and/or by controlling a size (either increase in sheath thickness or decrease in sheath thickness). Also, in some embodiments, by controlling the shape of the plasma 180 sheath near the edge ring 167, it is possible to control various properties of the bulk plasma 180 over the wafer W. Also, in some embodiments, the TES system is operated to control a density of the plasma 180 near the edge ring 167. For example, in some embodiments, the TES system is operated to either increase or decrease the density of the plasma 180 near the edge ring 167. Also, in some embodiments, the TES system is operated to control a bias voltage present on the edge ring 167, which in turn controls/ influences movement of ions and other charged constituents within the plasma 180 near the edge ring 167. For example, in some embodiments, the TES system is operated to control a bias voltage present on the edge ring 167 to attract more ions from the plasma 180 toward the edge of the wafer W. And, in some embodiments, the TES system is operated to control a bias voltage present on the edge ring 167 to repel ions from the plasma 180 away from the edge of the wafer W. It should be understood that the TES system can be operated to perform a variety of different functions, such as those mentioned above, among others, either separately or in combination.

In some embodiments, the coupling ring 161 is formed of a dielectric material, such as quartz, or ceramic, or alumina ($Al_2O_3$), or a polymer, among others.

A bottom surface of the edge ring 167 has a portion that is coupled to the upper surface of the coupling ring 161 through a layer of thermally and electrically conductive gel to thermally sink the coupling ring 161 to the edge ring 167. Also, the bottom surface of the edge ring 167 has another portion that is coupled to an upper surface of the electrode 109 through a layer of thermally and electrically conductive gel. Examples of the thermally and electrically conductive gel include polyimide, polyketone, polyetherketone, polyether sulfone, polyethylene terephthalate, fluoroethylene propylene copolymers, cellulose, triacetates, and silicone, among others. In some embodiments, the thermally and electrically conductive gel is formed as a double-sided tape. In some embodiments, the edge ring 167 has an inner diameter sized to be proximate to the outer diameter of the ceramic layer 110.

In various embodiments, the TES electrode 225 is formed of an electrically conductive material, such as platinum, steel, aluminum, or copper, among others. During operation, capacitive coupling occurs between the TES electrode 225 and the edge ring 167, such that the edge ring 167 is electrically powered to influence processing of the wafer W near the outer perimeter of the wafer W.

Broadly speaking, implementations of the disclosure provide for a CCP chamber having at least one magnetic coil positioned outside the chamber. In some implementations, a single magnetic coil or multiple magnetic coils are positioned above or on top of the chamber. A DC current is applied to the magnetic coil to generate a magnetic field (B-field). With the B-field from these currents, control over center non-uniformity is achieved. In some implementations, using a combination of different coils provides for different magnetic fields to enable more control over overall uniformity.

Standard plasma systems are prone to non-uniformities where there is accumulation of positive and negative ions, as their densities are at least partially controlled by electron density and further based on temperature. To address such non-uniformities, implementations of the disclosure contemplate the application of a static B-field to the plasma to minimize localized charged species accumulation and thereby improve uniformity.

Without being bound by any particular theory of operation, it is believed that in accordance with implementations of the disclosure, the B-field is configured to be relatively weak, so that it does not completely magnetize the plasma. However, electrons which are sensitive to the B-field are affected. Thus, it is believed that the B-field is used to change the direction of diffusion of the electrons so that the electrons travel approximately along the field lines. In this manner, the B-field can be utilized to affect and control the amount of electrons in the middle that discharge. By providing an approximately vertical B-field in the central portion of the plasma, from top to bottom, then electrons that tend to collect in the middle can magnetize so that the electrons move approximately along the B-field lines. Hence, there will be more losses to the upper and lower electrons, and therefore a consequent reduction in the amount of electrons in the center portion.

Figure 2A:
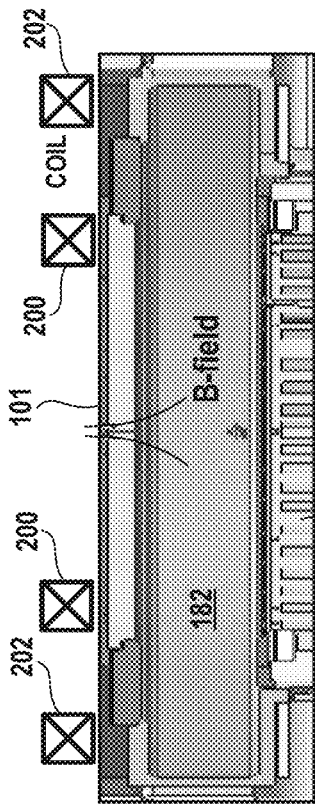
FIG. 2A conceptually illustrates a cross-section of a process chamber having a single magnetic coil for applying a magnetic field during plasma processing, in accordance with implementations of the disclosure.

FIG. 2A conceptually illustrates a cross-section of a process chamber having a single magnetic coil for applying a magnetic field during plasma processing, in accordance with implementations of the disclosure. As shown, a single magnetic coil 200 is disposed over the chamber 101. It will be appreciated that the magnetic coil 200 is substantially circular in shape or ring-shaped or annular in shape. Further, the magnetic coil 200 is disposed along a plane that is parallel to the surface plane of the wafer. That is, the windings/turns of the magnetic coil are substantially along a horizontal plane that is parallel to the plane of the wafer, so that the magnetic coil itself is horizontally oriented, and centered about an axis perpendicular through the center of the wafer. In some implementations, the magnetic coil 200 has a diameter (center to center diameter, or inner diameter, or outer diameter) in the range of approximately 15 to 20 inches (approximately 38 to 51 cm) for a chamber configured to process a 300 mm wafer; in some implementations, the diameter is in the range of approximately 16 to 18 inches (approximately 41 to 46 cm).

In some implementations, the height of the magnetic coil 200 above the surface level of the wafer is in the range of approximately 3 to 15 inches (approximately 8 to 38 cm); in some implementations, in the range of approximately 5 to 12 inches (approximately 13 to 30 cm); in some implementations, approximately 7 to 8 inches (approximately 18 to 20 cm).

In accordance with implementations of the disclosure, a DC current is applied to the magnetic coil 200 to produce a static B-field in the chamber 101.

Figure 2B:
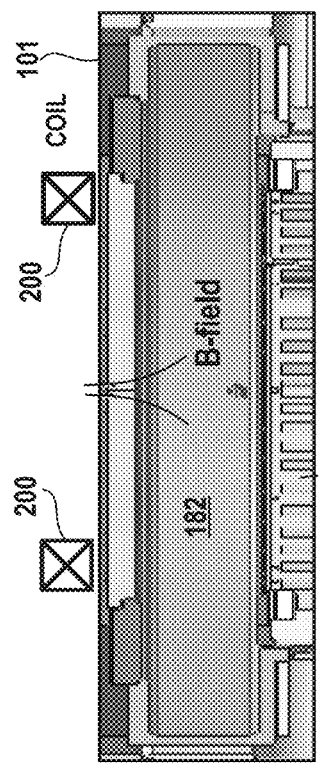
FIG. 2B conceptually illustrates a cross-section of a process chamber having two magnetic coils for applying a magnetic field during plasma processing, in accordance with implementations of the disclosure.

FIG. 2B conceptually illustrates a cross-section of a process chamber having two magnetic coils for applying a magnetic field during plasma processing, in accordance with implementations of the disclosure. As shown, a first magnetic coil 200 and a second magnetic coil 202 are concentric coils disposed over the chamber 101. In some implementations, the first and second magnetic coils 200 and 202 are approximately coplanar. In some implementations, the first and second magnetic coils 200 and 202 are not coplanar, but positioned in parallel planes, while being concentric about the same central axis. In some implementations, the first magnetic coil 200 has a diameter as described above with respect to FIG. 2A.

In some implementations, the second magnetic coil 202 has a diameter (center to center diameter, or inner diameter, or outer diameter) in the range of approximately 20 to 25 inches (approximately 51 to 63 cm) for a chamber configured to process a 300 mm wafer; in some implementations, the diameter of the second magnetic coil 202 is in the range of approximately 22 to 24 inches (approximately 56 to 61 cm).

In accordance with implementations of the disclosure, DC currents are applied to the magnetic coils 200 and 202 to produce a static B-field in the chamber 101. In various implementations, the DC currents applied to each of the coils can be approximately the same or different, and in the same direction or opposite directions.

Though not specifically shown, it will be appreciated that in other implementations, there can be additional magnetic coils disposed over the chamber 101. For example, in some implementations, a third magnetic coil is provided, also disposed over the chamber 101, and having a diameter smaller than the first magnetic coil 200. In some implementations, such a third magnetic coil has a diameter in the range of approximately 10 to 15 inches (approximately 25 to 38 cm) for a chamber configured to process a 300 mm wafer; in some implementations, the third magnetic coil has a diameter in the range of approximately 11 to 13 inches (approximately 28 to 33 cm).

In some implementations, the first, second and third magnetic coils are approximately coplanar. In some implementations, the first, second, and third magnetic coils are not coplanar, but positioned in parallel planes, while being concentric about the same central axis. In some implementations, two of the magnetic coils are coplanar, while the other magnetic coil is not coplanar with either of the two that are coplanar.

In some implementations, there can be additional magnetic coils disposed over the chamber 101.

Figure 2C:
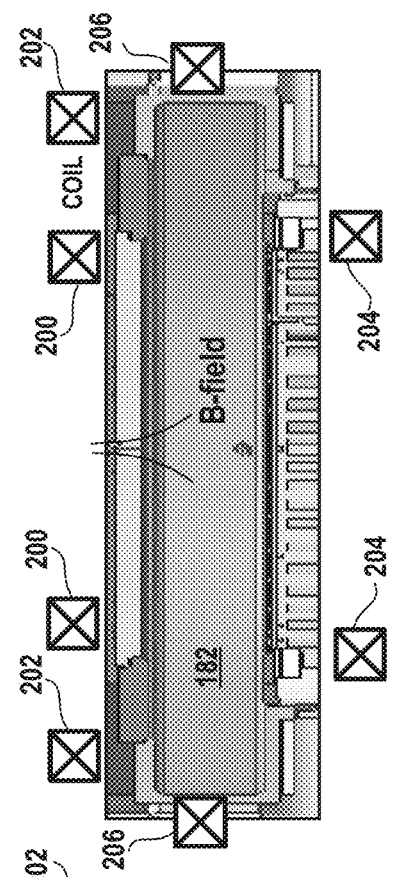
FIG. 2C conceptually illustrates a cross-section of a process chamber having three magnetic coils for applying a magnetic field during plasma processing, in accordance with implementations of the disclosure.

FIG. 2C conceptually illustrates a cross-section of a process chamber having three magnetic coils for applying a magnetic field during plasma processing, in accordance with implementations of the disclosure. As shown in the illustrated implementation, two magnetic coils 200 and 202 are disposed over the chamber 101. In some implementations, the magnetic coils 200 and 202 are configured similar to the implementation of FIG. 2B. Furthermore, a bottom magnetic coil 204 is disposed below the electrode 109, so as to be below the plasma processing region 182. In some implementations, the bottom magnetic coil 204 has a diameter (center to center diameter, or inner diameter, or outer diameter) in the range of approximately 10 to 25 inches (approximately 25 to 63 cm). In accordance with implementations of the disclosure, a DC current is applied to the magnetic coil 204, alone or in combination with DC current applied to other magnetic coils, to produce a static B-field in the chamber 101.

Though a single bottom magnetic coil 204 is shown and described in the illustrated implementation, in other implementations, there can be more than one bottom magnetic coil. In the case of multiple bottom magnetic coils, such bottom magnetic coils can be coplanar or not coplanar with each other.

Figure 2D:
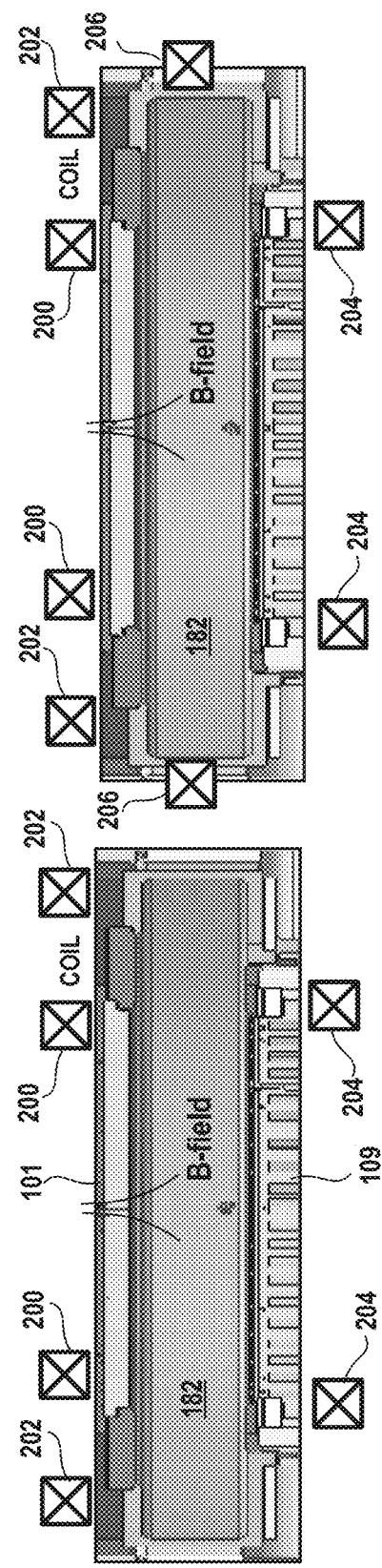
FIG. 2D conceptually illustrates a cross-section of a process chamber having four magnetic coils for applying a magnetic field during plasma processing, in accordance with implementations of the disclosure.

FIG. 2D conceptually illustrates a cross-section of a process chamber having four magnetic coils for applying a magnetic field during plasma processing, in accordance with implementations of the disclosure. As shown in the illustrated implementation, similar to the configuration of FIG. 2C, there are two magnetic coils 200 and 202 disposed over the chamber 101, and a bottom magnetic coil 104 disposed below the electrode 109. Furthermore, a side magnetic coil 206 is positioned so as to laterally surround the plasma processing region 182. In some implementations, the side magnetic coil 206 is positioned adjacent to the C-shroud member 185. In some implementations, the side magnetic coil 206 is positioned adjacent to the walls 101a of the chamber 101. In some implementations, the side magnetic coil 206 is vertically positioned so as to be approximately at the height of at least a portion of the plasma processing region 182. In some implementations, the side magnetic coil 206 has a diameter (center to center diameter, or inner diameter, or outer diameter) in the range of approximately 25 to 30 inches (approximately 63 to 76 cm) for a chamber configured to process a 300 mm wafer. In accordance with implementations of the disclosure, a DC current is applied to the magnetic coil 206, alone or in combination with DC currents applied to other magnetic coils, to produce a static B-field in the chamber 101.

Though a single side magnetic coil 206 is shown and described in the illustrated implementation, in other implementations, there can be more than one side magnetic coil. In some implementations, multiple side magnetic coils are provided and configured to have the same diameter and are vertically aligned with one another. In some implementations, multiple side magnetic coils can have different diameters and may be coplanar or non-coplanar with one another.

As described, in various implementations, there can be one or more magnetic coils positioned above, below, and/or surrounding the plasma processing region 182. Each magnetic coil is supplied with a DC current to generate a static B-field in the plasma processing region 182. Broadly speaking, in some implementations, the B-field is created substantially in the z-direction in the central portion of the plasma processing region 182, so as to effect suppression of the center etch rate. Thus, if a given CCP chamber exhibits a peak in etch rate at the center portion of the wafer, then the B-field can be applied to the plasma to suppress the center peak.

In some implementations, a magnetic coil in accordance with implementations of the disclosure is formed from insulated copper wire, or magnet wire. In some implementations, the magnet wire is approximately 16 to 10 AWG magnet wire. In some implementations, the coiling of the magnet wire is configured to have approximately 30 to 60 turns for a given magnetic coil. In some implementations, the coiling is configured to have approximately 40 to 50 turns. In some implementations, the magnetic coil has a cross sectional width or height of approximately 1 to 3 cm.

In some implementations, a magnetic coil in accordance with implementations of the disclosure is supported by a support structure. In some implementations, such a support structure is formed from an insulating material (e.g. plastic insulator), so as to further insulate the magnetic coil from other components or hardware. However, in some implementations, the coil support structure is not necessarily formed from an insulating material, as the coil winding itself may be insulated (e.g. insulated magnet wire). Thus, in some implementations, the support structure is made of a metal (e.g. aluminum) or other non-insulating material. Furthermore, in some implementations, an insulation layer is defined between the coil and a metal support structure.

By comparison to other applications of magnetic fields in the context of plasma processing, the B-field generated in accordance with implementations of the disclosure is a low strength field, so that there is minimal effect on other components. However, electrons in the plasma are affected by the B-field in such a manner as to promote reduced localized accumulation of charged species and therefore improve plasma and etch uniformity. In some implementations, the strength of the generated B-field is configured to be less than approximately 10 Gauss (measured at the wafer level and approximately in the center); in some implementations, less than approximately 5 Gauss.

It will be appreciated that correspondingly low current levels are applied to produce the weak magnetic fields in accordance with implementations of the disclosure. In some implementations, the applied current to a given magnetic coil is approximately 10 amps or less; in some implementations, approximately 7 amps or less; in some implementations, approximately 5 amps or less; in some implementations, approximately 3 amps or less.

Though a low strength magnetic field is provided, the chamber walls are typically constructed from an aluminum and/or silicon-containing material, and therefore the B-field penetrates the chamber.

Still, even a low strength magnetic field may interfere with nearby devices. Hence, in some implementations, a cover constructed from a nickel-containing material is provided, to shield nearby devices from the magnetic field.

Previous applications of a magnetic field in plasma processing have employed a much stronger magnetic field, where the direction of the field is parallel to the wafer. This promoted electron movement along B-field lines parallel to the surface of the wafer, and was performed as a way to control overall uniformity. However, such applications were prone to device damage, as there was also charge accumulation on the device, and the interaction of the strong B-field tended to produce device damage.

However, in contrast to these prior uses of a strong magnetic field, implementations of this disclosure employ a very low strength B-field by comparison. It has been observed that B-fields generated by magnetized steel parts, and even very weak electric fields, can have an effect on uniformity at the center. Further, as device sizes shrink and the tolerance for non-uniformity is reduced (e.g. significantly below 1%), so changes in ion density can have a significant impact on uniformity. Generally, in accordance with implementations of the disclosure, the greater the strength of the B-field that is applied, the greater the suppression of etch rate in the center portion of the wafer.

In some implementations, a static B-field is applied to improve the uniformity of a continuous wave plasma process.

However, in some implementations, pulsed plasmas are employed (e.g. having multiple RF states S0, S1, S2, etc.; or, level-to-level RF pulsing) which are generally more complicated in their behavior than continuous wave (CW) plasmas. Pulsed plasmas are also prone to radial non-uniformity, with a tendency to exhibit higher etch rates in the central region of the wafer.

Without being bound by any particular theory of operation of the present embodiments, a discussion of the reasons for radial non-uniformity in pulsed plasma is nonetheless provided herein for purposes of improved understanding of the present disclosure, and to provide possible mechanisms of operation by way of example without limitation.

In a level-to-level pulsed plasma, the RF waveform typically has at least two distinct RF states, a high-power state S1, and a low-power state S0. During state S1, there is a rapid ramp-up in power and voltage, which generally increases plasma density overall, but the localized density of various species within the plasma can vary to a large extent.

In an electronegative plasma, there are equal amounts of positive and negative charges, with the positive charges consisting primarily of positive ions, and the negative charges consisting of electrons and negative ions. So after striking plasma, these species are generated at various locations, but importantly, the various charged species have different masses. Because electrons are very light, when the electric fields are propagated through the plasma, the electrons can follow the fields with relative immediacy. However, the negative ions are heavy by comparison, and have greater inertia, and therefore move slower in response to the electric fields. The result of this activity is the creation of a front of negative ions that follows the potential inside the plasma, as conceptually shown at FIG. 3A.

Figure 3A:
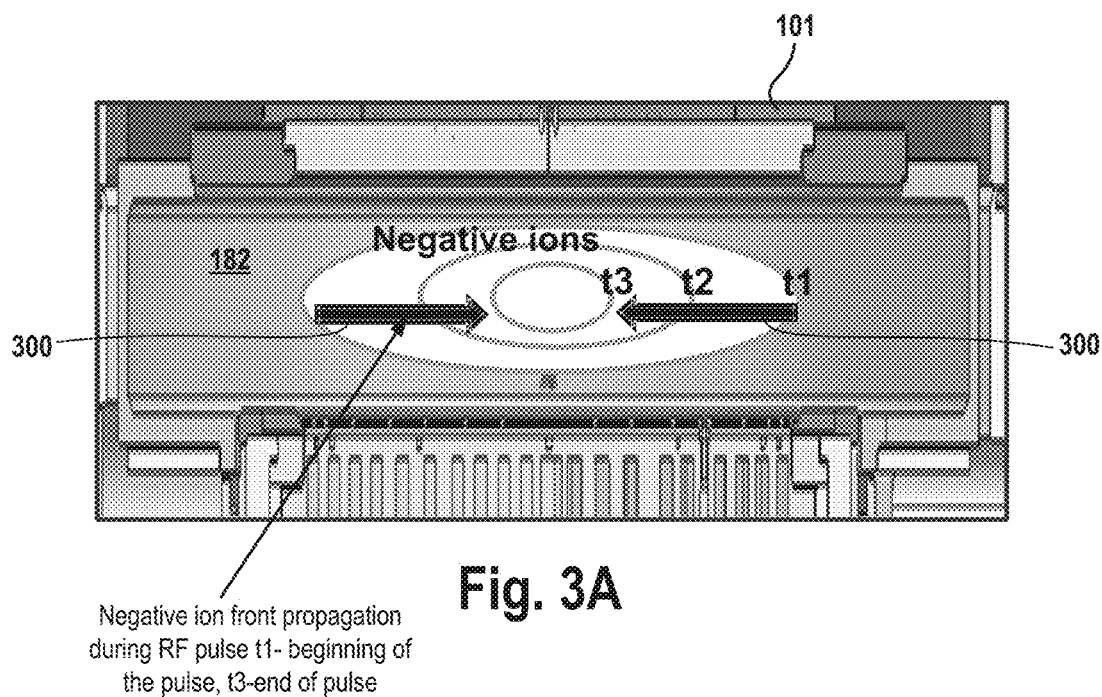
FIG. 3A conceptually illustrates propagation of negative ions in a plasma during an RF pulse, showing different densities at different times, in accordance with implementations of the disclosure.

FIG. 3A conceptually illustrates propagation of negative ions in a plasma during an RF pulse, showing different densities at different times, in accordance with implementations of the disclosure. As shown in the illustrated cross-section view of the chamber 101, the negative ion front at various times during an RF pulse is conceptually shown by the concentric ovals, and the inward movement of the negative ion front is conceptually illustrated by the arrows 300. The negative ion front at the beginning of the RF pulse (beginning of state S1) is conceptually shown by the oval t1; the negative ion front during an intermediate time of the RF pulse (intermediate portion of state S1) is conceptually shown by the oval t2; and the negative ion front at the end of the RF pulse (end of state S1) is conceptually shown by the oval t3. Thus, the negative ions move radially inward (both horizontally and vertically inward) toward the center region of the plasma process region 182 during the RF pulse.

Thus, during RF pulsing, ions move towards the center both from the sides, and from the top and bottom, and this creates ion waves (also known as ion acoustic waves). Thus, as power/voltage is increased, there is a front of negative species moving towards the center. And as the negative species migrate towards the center, they attract positive ions. The negative ions tend to become trapped in the center, because of potential barriers. The plasma is typically positive with respect to ground, and the negative ions encounter this as a barrier and cannot escape. Thus, in summary, when the S1 high powered state ignites, negative ions are created throughout the chamber, but because of the tendency to have increased density in the center, the result is nonuniformity in the center with a mixed charge of negative and positive ions. The negative ions tend to become trapped in the center and because of the field cannot escape. Thus, in a pulsed plasma, nothing is static as all species are moving while pulsing plasma (alternating high and low voltage), and negative ions tend to be trapped in the center.

To address the above-described problems which cause etch non-uniformity, implementations of the present disclosure apply pulsed magnetic fields to affect electrons in the plasma. The pulsed magnetic fields form radial B-field gradients, to control radial electron diffusion, and thereby affect radial positive and negative ion acoustic waves. By changing the electron flows in the plasma, the negative ions can be distributed more uniformly throughout the plasma as opposed to being concentrated in the center. Negative ions are generally created by neutral species attaching electrons, and therefore by controlling electrons, it is possible to control the negative ions.

More specifically, in some implementations, a pulsed DC current is provided to a magnetic coil in synchronization with the pulsed RF, thereby creating a time-varying radial gradient of B-field in the plasma that disturbs the charged species and thereby minimizes localized charged species accumulation. Radial electron diffusion is thus controlled, which therefore enables control of radial negative and positive ion acoustic waves.

Figure 3B:
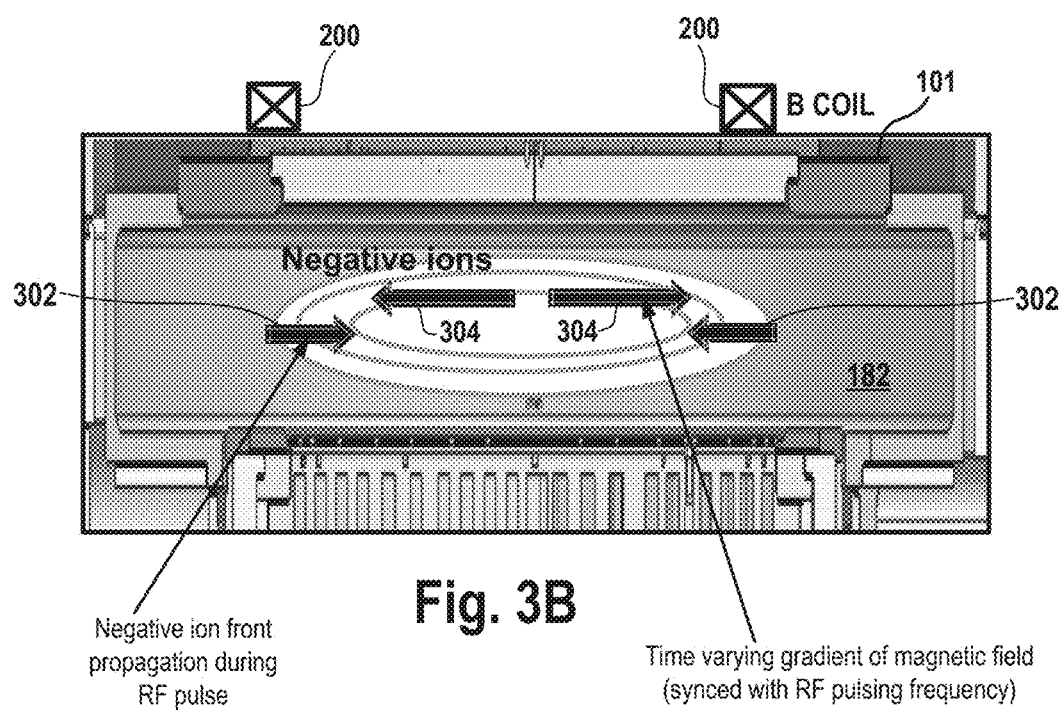
FIG. 3B conceptually illustrates application of a synchronized time-varying magnetic field that opposes the central accumulation of negative ions in plasma, in accordance with implementations of the disclosure.

FIG. 3B conceptually illustrates application of a synchronized time-varying magnetic field that opposes the central accumulation of negative ions in plasma, in accordance with implementations of the disclosure. As shown in the illustrated cross-section, a magnetic coil 200 is additionally provided over the chamber 101. A pulsed DC current is applied to the magnetic coil 200 in synchronization with the RF pulsing frequency, which produces a time-varying gradient of magnetic field that is also synchronized with the RF pulsing frequency.

The negative ion front propagation during the RF pulse is conceptually shown by the arrows 302, demonstrating the inward movement of negative ions. However, the time-varying gradient of magnetic field (that is synchronized with the RF pulsing frequency), as conceptually shown by the arrows 304, operates to oppose the negative ion front propagation, preventing the negative ions from accumulating in the center region of the plasma process region 182. The time-varying magnetic field acts to push electrons in the plasma in synchronization to the pulsed RF, in a manner that disrupts or opposes the wave of negative ions, so that they do not become trapped in the center.

Figure 4:
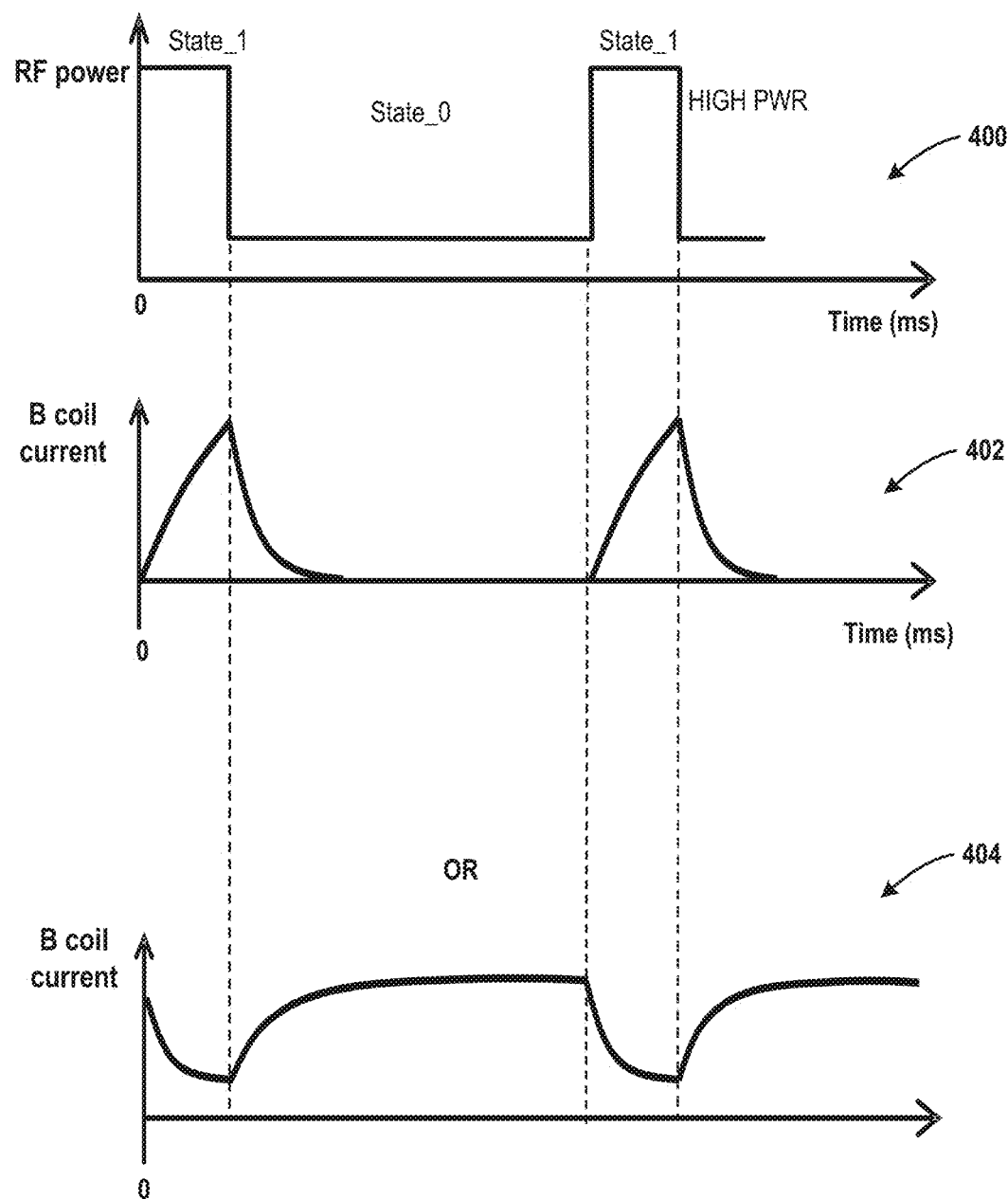
FIG. 4 illustrates a series of graphs showing possible timings of pulsed DC currents in relation to RF pulses, in accordance with implementations of the disclosure.

FIG. 4 illustrates a series of graphs showing possible timings of pulsed DC currents in relation to RF pulses, in accordance with implementations of the disclosure. A pulsed DC current applied to a magnetic coil as described above can be synchronized to the RF pulsing in various ways. In the illustrated implementation, the graph 400 conceptually illustrates RF power versus time for a two-state pulsed RF signal. As shown, a high power state (State 1) alternates with a low power state (State 2).

In some implementations, pulsed DC current applied to a magnetic coil (such as magnetic coil 200) is synchronized to the pulsed RF as shown by the graph 402, which illustrates current in the magnetic coil versus time, with DC current pulses being synchronized with State 1. That is, DC current to the magnetic coil is turned on at the start of State 1 (or the end of State 0), and turned off at the end of State 1 (or the start of State 0). However, because of the magnetic coil's inductance and time constant, the current flow in the coil is delayed. Hence, when the DC current is turned on at the start of the DC pulse, current in the magnetic coil ramps up gradually, and when the DC current is turned off at the end of the DC pulse, current in the coil decays gradually. During the State 0 time period, the current level in the magnetic coil decays to substantially zero, as shown in the illustrated implementation. And thus the current rises from substantially zero when the next DC pulse initiates. Accordingly, the applied B-field gradually increases from, and gradually decays back to, a substantially zero applied B-field.

In some implementations, pulsed DC current applied to a magnetic coil (such as magnetic coil 200) is synchronized to the pulsed RF as shown by the graph 404, which illustrates current in the magnetic coil versus time, with DC current pulses being synchronized with State 0. That is, DC current to the magnetic coil is turned on at the start of State 0 (or the end of State 1), and turned off at the end of State 0 (or the start of State 1). Again, because of the magnetic coil's inductance and time constant, the current flow in the coil is delayed, ramping up gradually and decaying gradually in response to the DC current turning on and off, respectively. It is further noted that in the illustrated implementation, some level of current is maintained in the coil throughout the cycle, as the current does not decay all the way to a substantially zero current level before the next DC pulse begins. Accordingly, the applied B-field gradually increases from, and gradually decays back to, some minimum (non-zero) level of applied B-field.

Because of the time constant, the magnetic field exhibits a gradual increase and decay in accordance with the current flow, producing a changing gradient of B-field in the plasma area. The timing of the changing gradient of B-field can be synchronized to the radially moving species so as to disrupt or prevent local accumulation, especially accumulation in the central region of the plasma process region.

Though synchronization of pulsed DC current to a two-state pulsed RF signal is shown and described, it will be appreciated that in various other implementations, the pulsed DC current can be synchronized to pulsed RF signals having three or more states.

As described, the DC current provided to the magnetic coil can be pulsed at the same frequency as the RF pulsing frequency. For example, if the RF pulsing frequency is at 1 kHz, so that each RF cycle is 1 millisecond, and State 1 is pulsed for about 100 microseconds, then in some implementations, DC current to the magnetic coil is pulsed at a frequency of 1 kHz. In some implementations, the DC current is pulsed for 100 microseconds during the State 1 time period; whereas in other implementations, the DC current is pulsed for 900 microseconds during the State 0 time period.

In some implementations, a user interface is provided for specifying parameters of the DC current pulsing. For example, in some implementations, the user interface enables specification of target current levels in the magnetic coil for each state of the RF pulsing cycle. In some implementations, the user interface enables specification of target current levels and corresponding durations of such current levels for a given DC current pulse cycle. In some implementations, the user interface enables specification of target B-field levels, rather than current levels.

In some implementations, the user interface also provides for specifying the current direction to be positive or negative. In some implementations, positive current entails DC current run through the magnetic coil in a counterclockwise direction when viewed from above; whereas negative current entails DC current run through the magnetic coil in a clockwise direction when viewed from above.

In some implementations, the user interface provides for specifying properties of the applied B-field itself, such as the B-field pulsed strength (e.g. as measured at a given location), its synchronization to particular RF pulsing states (e.g. pulsing synchronized to State 1 or State 0), a target B-field strength for a given RF pulsing state, etc. In some implementations, magnetic sensors are provided as feedback sensors to enable measurement of applied B-fields and achievement of target settings. For example, in response to setting of a particular B-field parameter, then current is applied and the B-field is monitored through the magnetic sensors.

It will be appreciated that a B-field sensor can be positioned at any number of locations to provide feedback. In some implementations, a B-field sensor is positioned approximately at or near the center of the magnetic coil (outside of the chamber). In some implementations, a B-field sensor is positioned inside of the chamber (in situ).

It will be appreciated that different magnetic coil configurations will have different time constants, and accordingly differ in terms of the amount of time required to build up current in the magnetic coil. As such, in various implementations, the parameters of the magnetic coil can be defined or tuned to achieve a desired time constant.

Figure 5:
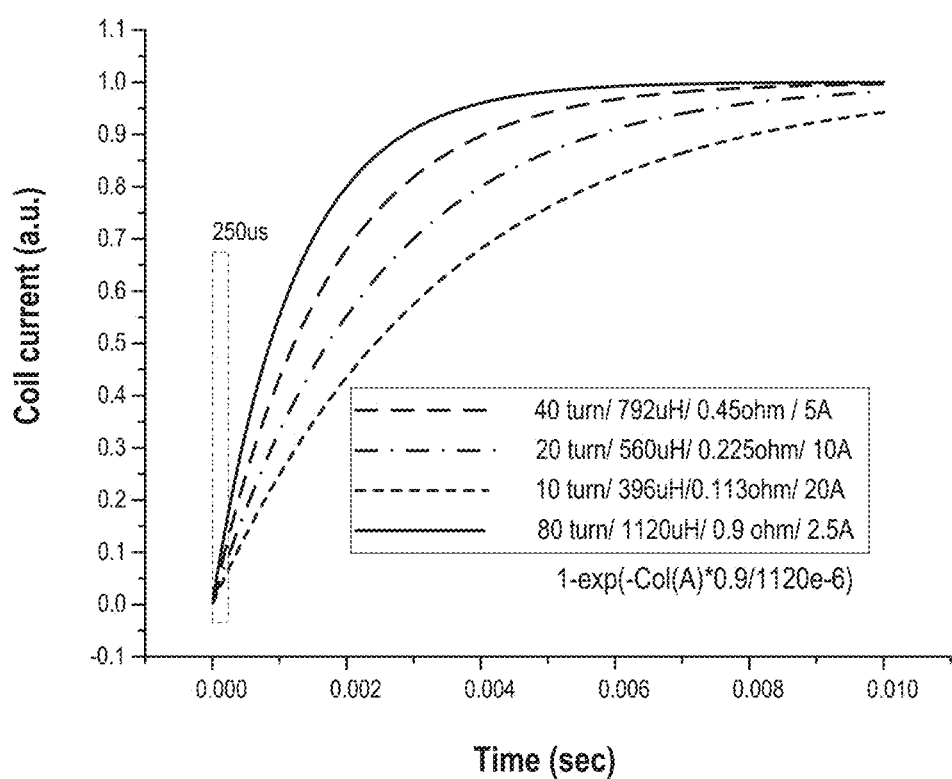
FIG. 5 is a graph illustrating current build up over time for various coil configurations, in accordance with implementations of the disclosure.

By way of example without limitation, FIG. 5 is a graph illustrating current build up over time for various coil configurations, in accordance with implementations of the disclosure. In the illustrated implementation, the several curves illustrate coil current as a fraction of applied target current, versus time (starting from zero current at zero time), for various magnetic coil configurations, respectively. The illustrated curves demonstrate how much time is required to ramp up current in the various coil configurations, which have respective inductance and resistance values as shown. By way of example as shown, for an 80-turn coil, in about 250 microseconds, approximately 20% of the applied current is achieved in the 80-turn coil.

Generally, the time constant is proportional to the inductance and inversely proportional to resistance. As shown in the illustrated graph, as the number of turns increases, the increase in resistance from the greater length of the coil dominates over the increase in inductance, so that the time constant is reduced as the number of turns increases, and hence the current ramp up is faster in higher-turn coils. Accordingly, the number of turns of the coil can be tuned to achieve the desired response time, e.g. to achieve x % current build up within a given amount of time.

In some implementations, for purposes of providing pulsed magnetic fields in synchronization to pulsed RF, the magnetic coil is configured to have a relatively low time constant to enable build-up of current quickly. In some implementations, the time constant is configured to be in the range of approximately 1.0 msec to 4.0 msec; in some implementations, the time constant is configured to be in the range of approximately 1.8 msec to 3.0 msec; the time constant is configured to be in the range of approximately 2.2 msec to 2.6 msec. In some implementations, the magnetic coil wire is configured to be in the range of about 6 to 16 AWG; in some implementations, about 8 to 14 AWG; in some implementations, about 10 to 12 AWG. In some implementations, the magnetic coil is configured to have about 5 to 80 turns; in some implementations, about 10 to 60 turns; in some implementations, about 20 to 40 turns.

As has been noted, center plasma non-uniformity in CCP systems can occur due to standing waves and localized accumulation of positive and negative ions. Another solution, in accordance with implementations of the disclosure, provides for the application of a radially swept B-field to the plasma to disturb and minimize localized charged species accumulation. The swept B-field enables trapping of electrons by the magnetic field, preventing build up of a double layer and controlling negative and positive ion acoustic waves in the radial direction.

Figure 6:
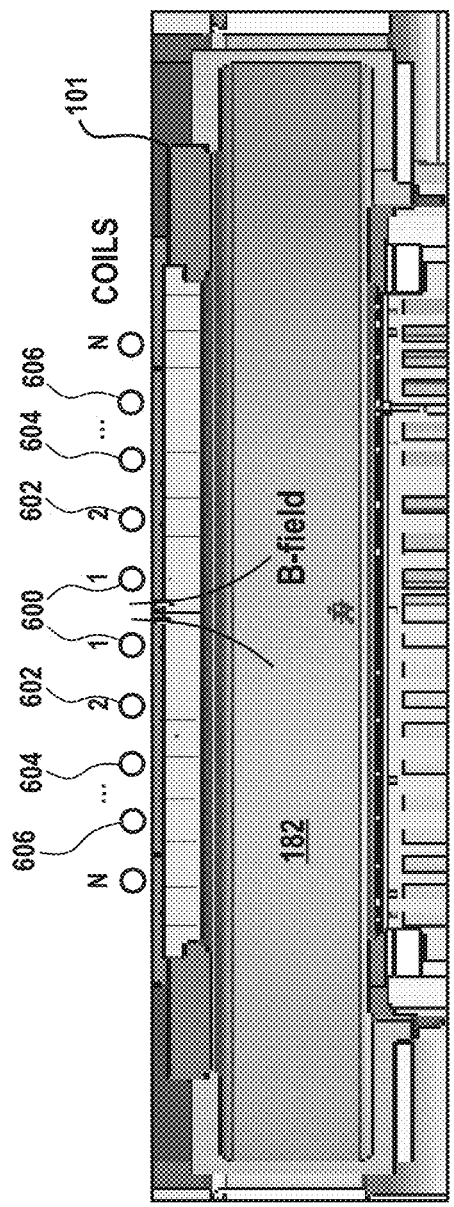
FIG. 6 is a conceptual cross-section view of a system for providing a swept radial magnetic field wave for radial uniformity tuning, in accordance with implementations of the disclosure.

FIG. 6 is a conceptual cross-section view of a system for providing a swept radial magnetic field wave for radial uniformity tuning, in accordance with implementations of the disclosure. A set of concentric magnetic coils is positioned over the chamber 101, above the upper electrode. In the illustrated implementation, the concentric magnetic coils include magnetic coils 600, 602, 604, 606, etc.

In some implementations, the concentric magnetic coils are substantially evenly spaced apart at a pitch (e.g. center-to-center) of about 1 to 15 cm; in some implementations, about 1 to 10 cm; in some implementations, about 1 to 2 cm.

In some implementations, the concentric magnetic coils are not evenly spaced apart, but configured so that pitch increases or decreases from center to peripheral coils.

In some implementations, the magnetic coil wire of the concentric magnetic coils is configured to be in the range of about 6 to 16 AWG; in some implementations, about 8 to 14 AWG; in some implementations, about 10 to 12 AWG. In some implementations, the concentric magnetic coils are configured to have about 5 to 80 turns; in some implementations, about 10 to 60 turns; in some implementations, about 20 to 40 turns.

In some implementations, the concentric magnetic coils have approximately the same number of turns each. In some implementations, the concentric magnetic coils do not have the same number of turns each, but rather may have different numbers of turns.

In the illustrated implementation, the concentric magnetic coils are substantially oriented along the same (horizontal) plane. That is, the concentric magnetic coils all have substantially the same height above the wafer plane. However, in some implementations, at least some of the concentric magnetic coils are not substantially oriented along the same plane, but rather oriented along substantially different planes, so as to have substantially different heights above the wafer plane.

In some implementations, each magnetic coil is independently powered, so as to enable independent control over the application of current to the individual coils. In some implementations, the magnetic coils are sequentially powered to create a sweeping radial magnetic field wave.

Figure 7:
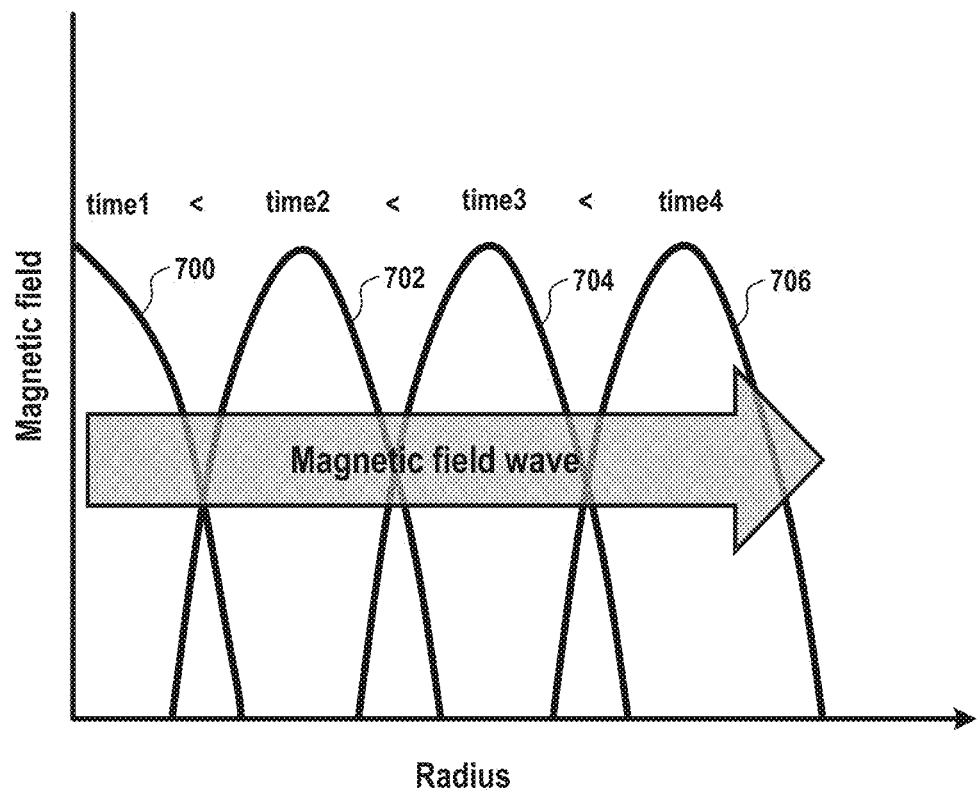
FIG. 7 is a graph conceptually illustrating the radial magnetic field wave generated by sequentially powering concentric magnetic coils, in accordance with implementations of the disclosure.

FIG. 7 is a graph conceptually illustrating the radial magnetic field wave generated by sequentially powering concentric magnetic coils, in accordance with implementations of the disclosure. In some implementations, the concentric magnetic coils are powered in consecutive/sequential order (e.g. from inside to outside coils) with DC current pulses that generate magnetic field pulses, that in combination produce a magnetic field wave. The concept is illustrated at FIG. 7, which shows a magnetic field wave at different times produced by the sequential powering of the concentric magnetic coils in order from inner to outer magnetic coils.

For example, the curve 700 illustrates the magnetic field produced at a first time; the curve 702 illustrates the magnetic field produced at a second time following the first time; the curve 704 illustrates the magnetic field produced at a third time following the second time; and the curve 706 illustrates the magnetic field produced at a fourth time following the third time, etc. As shown, the magnetic field migrates radially outward with time. Thus, by sequentially powering the magnetic coils, a swept radial magnetic field wave or pulse is generated that sweeps/propagates from inside to outside radially (center to periphery).

The radial magnetic field wave is configured to trap electrons and control the directionality of positive and negative ion acoustic waves. Furthermore, the radial magnetic field wave prevents the build up of double layers in plasma and reduces excessive ion density at the center region. Thus, radial plasma uniformity is improved, and radial etch uniformity is thereby improved.

It will be appreciated that the time delay between powering adjacent coils can depend upon plasma parameters (e.g. diffusion times). In some implementations, the time delay is on the order of microseconds to milliseconds (e.g. MHz to kHz frequency of pulsing). In some implementations, the B-field in the plasma process region 182 has a strength of at least 3 to 4 milliTesla in order to effectively confine electrons.

It will be appreciated that in some implementations, the sequential pulsing of power to the concentric magnetic coils may overlap from one coil to the next. That is, as power decays in one coil, powering of the next coil is initiated before the power in the previous coil completely decays.

Furthermore, in some implementations, initiation of the next magnetic field wave occurs prior to completion of the previous magnetic field wave. That is, as a first magnetic field wave propagates from center to periphery, a second magnetic field wave is initiated before the first magnetic field wave has fully propagated; and a third magnetic field wave is initiated before the second magnetic field wave has fully propagated, as so forth. To enable such magnetic field waves, multiple ones of the coils may be powered simultaneously in sequence. For example, the first (innermost) and fourth coils may be powered substantially simultaneously, followed by the second and fifth coils, followed by the third and sixth coils, etc. In some implementations, every other coil is powered substantially simultaneously so as to continually produce magnetic field waves. In some implementations, every third coil is powered substantially simultaneously so as to continually produce magnetic field waves.

Figure 8:
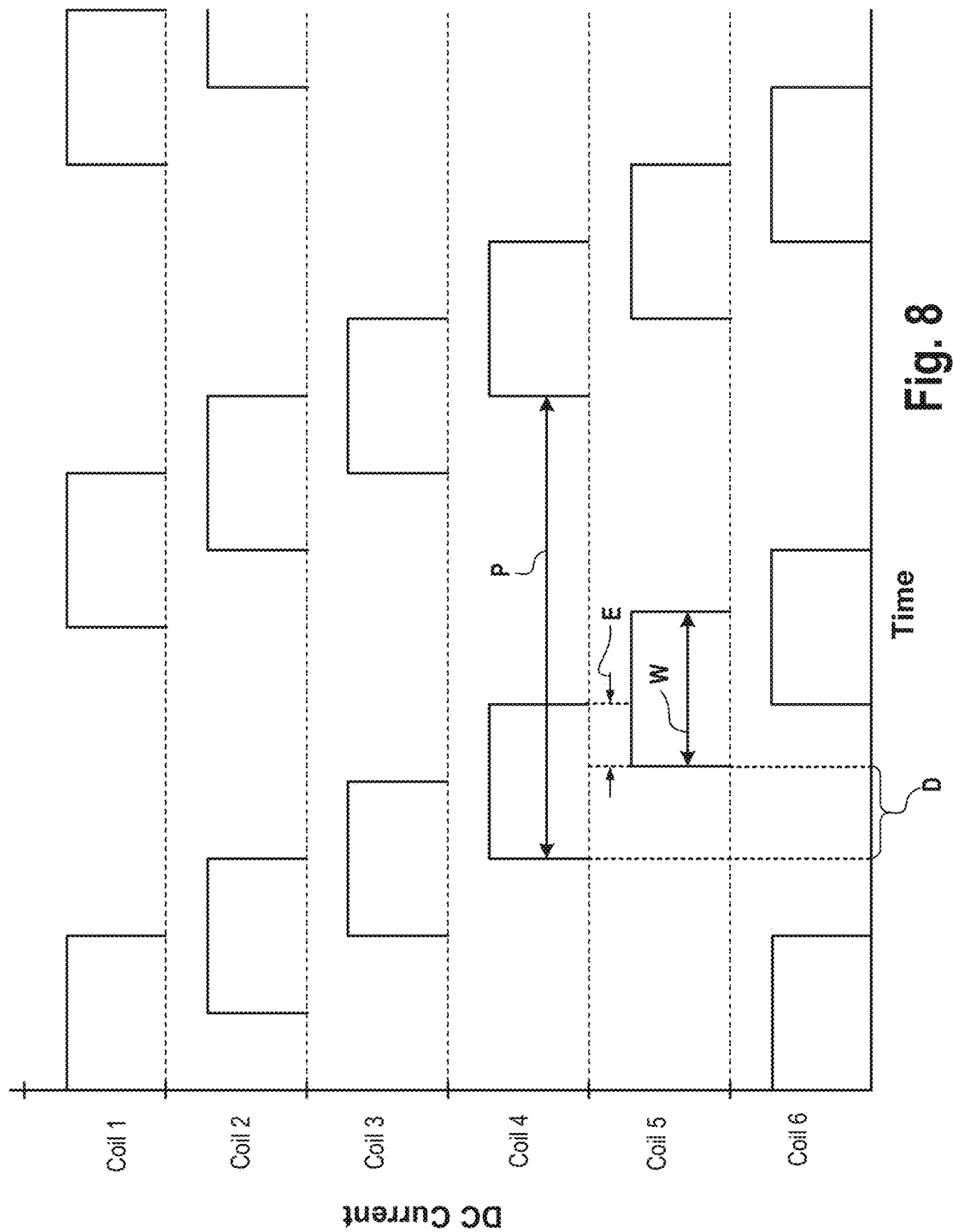
FIG. 8 is a graph conceptually illustrating sequential pulsing of current through a plurality of concentric magnetic coils, in accordance with implementations of the disclosure.

FIG. 8 is a graph conceptually illustrating sequential pulsing of current through a plurality of concentric magnetic coils, in accordance with implementations of the disclosure. Concentric magnetic coils can be provided as described above with respect to FIG. 6. In the illustrated graph of FIG. 8, by way of example without limitation, a conceptual example of overlapping sequential current pulses for a chamber coil configuration having six concentric coils is shown. In the illustrated implementation, Coil 1 to Coil 6 are indicated in order from inner to outer coils, with Coil 1 being the innermost of the concentric magnetic coils and Coil 6 being the outermost of the concentric coils. For each coil, DC current versus time is shown in the illustrated graph.

As indicated, each coil is provided with current pulses. For a given coil, the current pulses occur at regular intervals and have a period P as defined by the frequency of the pulses. Further, each current pulse has a duration W. Current pulses from one coil to the next adjacent coil are delayed by an amount of time D. That is, the start of the current pulse for the next adjacent coil is delayed from the start of the current pulse for the prior adjacent coil by the amount of time D. In some implementations, current pulses between adjacent coils overlap in time by an amount of time E. That is, the current pulse for a coil initiates before the end of the current pulse of the prior adjacent coil by the amount of time E.

Accordingly, current pulses through the concentric coils can be staggered in time and/or overlapping in time, and are cycled from inner to outer coils. In some implementations, a single cycle of current pulses is defined as the series of overlapping current pulses from the innermost to the outermost coil. In some implementations, the period P of the pulses can be variously configured so that each cycle of current pulses initiates before the previous cycle is completed. That is, cycles of current pulses in some implementations can be configured to overlap to a certain extent. For example, in the illustrated implementation, the period P is configured so that the next cycle initiates at approximately the time that the last current pulse of the last cycle, i.e. the next current pulse through coil 1 (innermost coil) initiates at approximately the same time as the current pulse through coil 6 (outermost coil) of the preceding cycle. In other implementations, cycles of current pulses can overlap to other extents. In still other implementations, cycles of current pulses do not overlap with each other.

Figure 9:
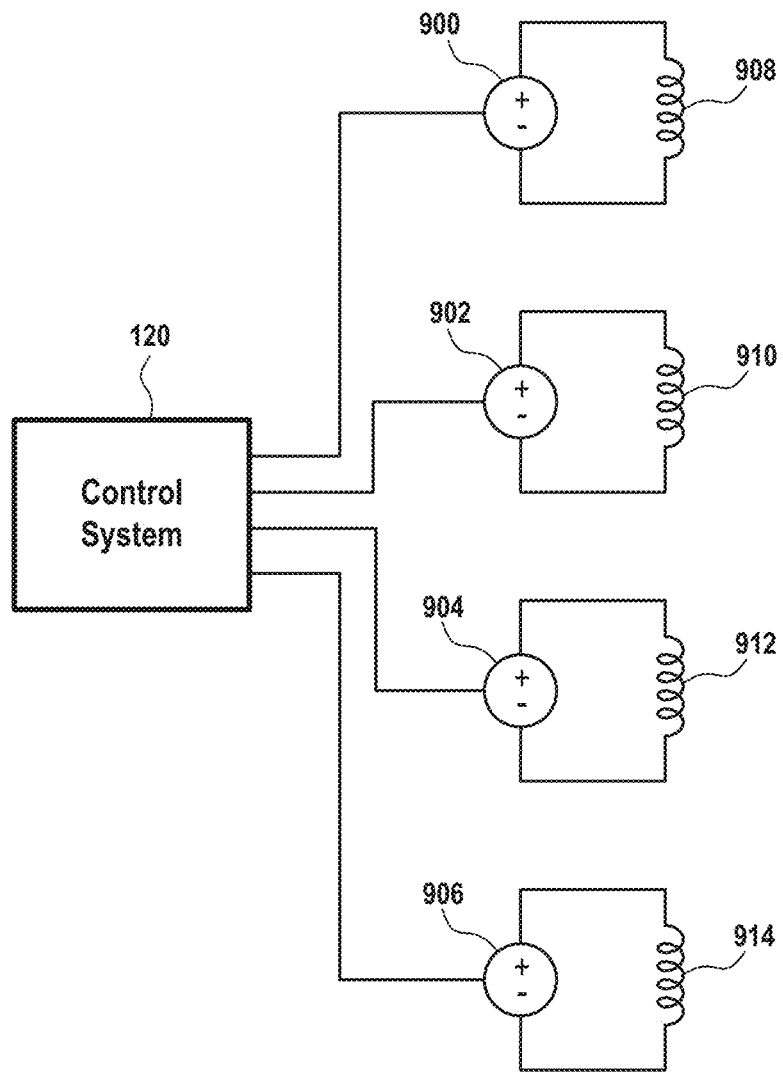
FIG. 9 is a conceptual schematic diagram of a system for controlling power to multiple magnetic coils, in accordance with implementations of the disclosure.

FIG. 9 is a conceptual schematic diagram of a system for controlling power to multiple magnetic coils, in accordance with implementations of the disclosure. In the illustrated implementation, the control system 120 is operatively connected to, and controls the operation of, several DC power supplies 900, 902, 904, and 906. The DC power supplies respectively apply a DC current to magnetic coils 908, 910, 912, and 914. The control system 120 can control the magnitude/strength of the DC current (e.g. Amperage) and the polarity (e.g. positive or negative; or, counterclockwise or clockwise) of the DC current supplied by a given one of the DC power supplies.

In some implementations, the magnetic coils 908, 910, 912, and 914 are the coils A, B, C, and D described above. In some implementations, the magnetic coils 908, 910, 912, and 914 can be any of the magnetic coils described in accordance with the various implementations of the disclosure. Though four magnetic coils and four corresponding DC power supplies are shown, it will be appreciated that there can be additional magnetic coils and DC power supplies in other implementations.

In some implementations, a user interface is provided to enable an operator to adjust the parameters of the DC power supplies, such as by providing settings for adjustment of the DC current magnitude, and its polarity, for any given DC power supply.

As has been discussed, in some implementations, application of a B-field during plasma processing can be used to reduce plasma non-uniformity, and thereby reduce etch non-uniformity. Furthermore, in some implementations, application of the B-field can be used for chamber matching, to compensate for variation between tools due to environmental magnetic fields. Ambient magnetic fields can vary from tool to tool, and therefore an applied B-field can be used to counter/offset such ambient environmental fields, and thereby provide consistency from tool to tool.

It will be appreciated that any of the methods described in the present disclosure can be implemented to run automatically by the control system 120.

Figure 10:
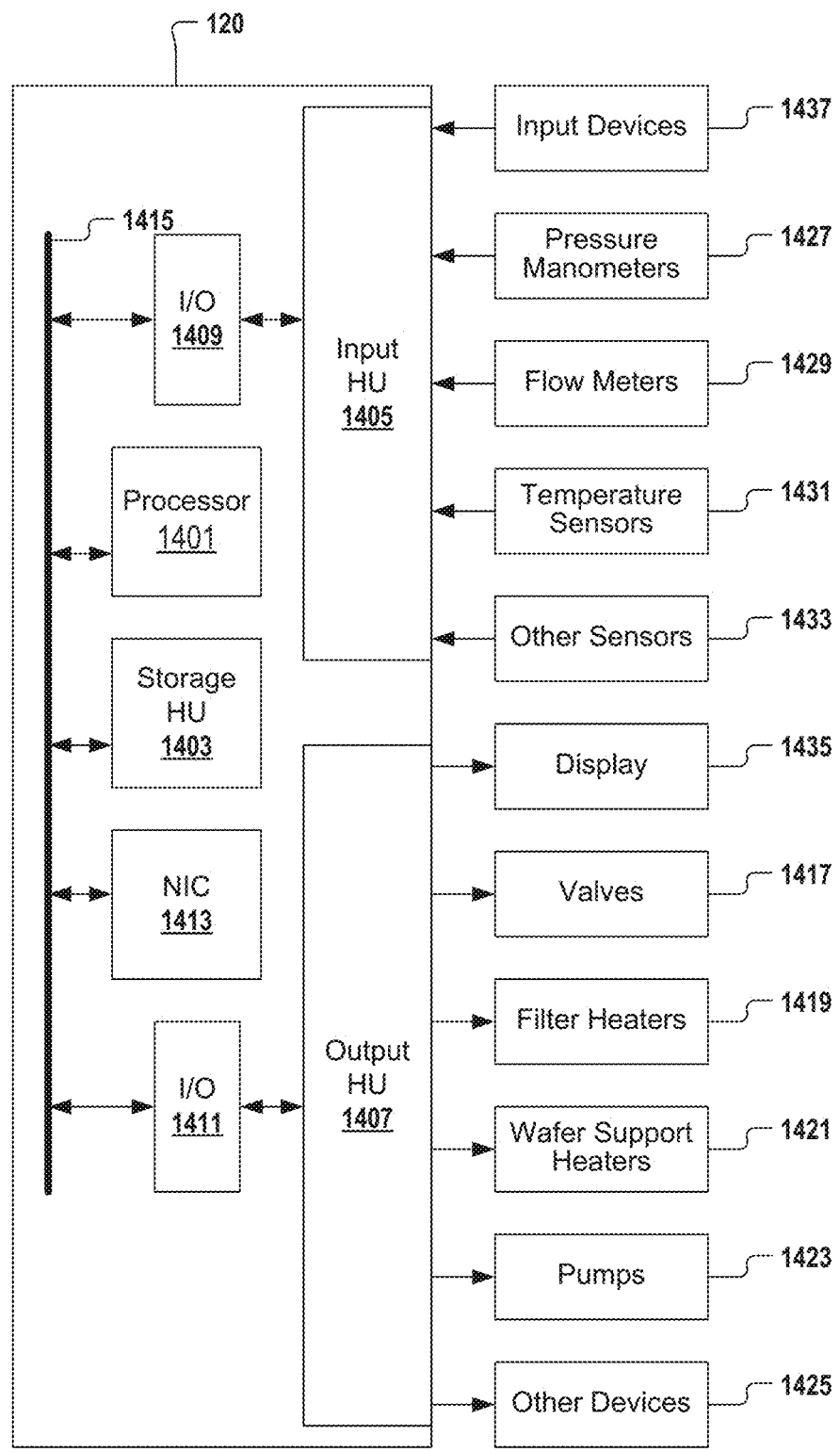
FIG. 10 shows an example schematic of the control system of FIG. 1, in accordance with some embodiments.

FIG. 10 shows an example schematic of the control system 120 of FIG. 1, in accordance with some embodiments. In some embodiments, the control system 120 is configured as a process controller for controlling the semiconductor fabrication process performed in plasma processing system 100. In various embodiments, the control system 120 includes a processor 1401, a storage hardware unit (HU) 1403 (e.g. memory), an input HU 1405, an output HU 1407, an input/output (I/O) interface 1409, an I/O interface 1411, a network interface controller (NIC) 1413, and a data communication bus 1415. The processor 1401, the storage HU 1403, the input HU 1405, the output HU 1407, the I/O interface 1409, the I/O interface 1411, and the NIC 1413 are in data communication with each other by way of the data communication bus 1415. The input HU 1405 is configured to receive data communication from a number of external devices. Examples of the input HU 1405 include a data acquisition system, a data acquisition card, etc. The output HU 1407 is configured to transmit data to a number of external devices. An examples of the output HU 1407 is a device controller. Examples of the NIC 1413 include a network interface card, a network adapter, etc. Each of the I/O interfaces 1409 and 1411 is defined to provide compatibility between different hardware units coupled to the I/O interface. For example, the I/O interface 1409 can be defined to convert a signal received from the input HU 1405 into a form, amplitude, and/or speed compatible with the data communication bus 1415. Also, the I/O interface 1407 can be defined to convert a signal received from the data communication bus 1415 into a form, amplitude, and/or speed compatible with the output HU 1407. Although various operations are described herein as being performed by the processor 1401 of the control system 120, it should be understood that in some embodiments various operations can be performed by multiple processors of the control system 120 and/or by multiple processors of multiple computing systems in data communication with the control system 120.

In some embodiments, the control system 120 is employed to control devices in various wafer fabrication systems based in-part on sensed values. For example, the control system 120 may control one or more of valves 1417, filter heaters 1419, wafer support structure heaters 1421, pumps 1423, and other devices 1425 based on the sensed values and other control parameters. The valves 1417 can include valves associated with control of the backside gas supply system 129, the process gas supply system 191, and the temperature control fluid circulation system 125. The control system 120 receives the sensed values from, for example, pressure manometers 1427, flow meters 1429, temperature sensors 1431, and/or other sensors 1433, e.g. voltage sensors, current sensors, etc. The control system 120 may also be employed to control process conditions within the plasma processing system 100 during performance of plasma processing operations on the wafer W. For example, the control system 120 can control the type and amounts of process gas(es) supplied from the process gas supply system 191 to the plasma processing region 182. Also, the control system 120 can control operation of the first radiofrequency signal generator 147, the second radiofrequency signal generator 149, the impedance matching system 143, the TES radiofrequency signal generator 213, and the TES impedance matching system 211. Also, the control system 120 can control operation of the DC supply 117 for the clamping electrode(s) 112. The control system 120 can also control operation of the lifting devices 133 for the lift pins 132 and operation of the door 107. The control system 120 also controls operation of the backside gas supply system 129 and the temperature control fluid circulation system 125. The control system 120 also control vertical movement of the cantilever arm assembly 115. The control system 120 also controls operation of the throttle member 196 and the pump that controls suction at the exhaust port 105. The control system 120 also controls operation of the hold-down control mechanisms 913 of the hold-down rods 911 of the TES system 1000. The control system 120 also receives input from the temperature probe of the TES system 1000. It should be understood that the control system 120 is equipped to provide for programmed and/or manual control any function within the plasma processing system 100.

In some embodiments, the control system 120 is configured to execute computer programs including sets of instructions for controlling process timing, process gas delivery system temperature, and pressure differentials, valve positions, mixture of process gases, process gas flow rate, backside cooling gas flow rate, chamber pressure, chamber temperature, wafer support structure temperature (wafer temperature), RF power levels, RF frequencies, RF pulsing, impedance matching system 143 settings, cantilever arm assembly position, bias power, and other parameters of a particular process. Other computer programs stored on memory devices associated with the control system 120 may be employed in some embodiments. In some embodiments, there is a user interface associated with the control system 120. The user interface include a display 1435 (e.g. a display screen and/or graphical software displays of the apparatus and/or process conditions), and user input devices 1437 such as pointing devices, keyboards, touch screens, microphones, etc.

Software for directing operation of the control system 120 may be designed or configured in many different ways. Computer programs for directing operation of the control system 120 to execute various wafer fabrication processes in a process sequence can be written in any conventional computer readable programming language: for example, assembly language, C, C++, Pascal, Fortran or others. Compiled object code or script is executed by the processor 1401 to perform the tasks identified in the program. The control system 120 can be programmed to control various process control parameters related to process conditions such as, for example, filter pressure differentials, process gas composition and flow rates, backside cooling gas composition and flow rates, temperature, pressure, plasma conditions, such as RF power levels and RF frequencies, bias voltage, cooling gas/fluid pressure, and chamber wall temperature, among others. Examples of sensors that may be monitored during the wafer fabrication process include, but are not limited to, mass flow control modules, pressure sensors, such as the pressure manometers 1427 and the temperature sensors 1431. Appropriately programmed feedback and control algorithms may be used with data from these sensors to control/adjust one or more process control parameters to maintain desired process conditions.

In some implementations, the control system 120 is part of a broader fabrication control system. Such fabrication control systems can include semiconductor processing equipment, including a processing tools, chambers, and/or platforms for wafer processing, and/or specific processing components, such as a wafer pedestal, a gas flow system, etc. These fabrication control systems may be integrated with electronics for controlling their operation before, during, and after processing of the wafer. The control system 120 may control various components or subparts of the fabrication control system. The control system 120, depending on the wafer processing requirements, may be programmed to control any of the processes disclosed herein, including the delivery of processing gases, the delivery of backside cooling gases, temperature settings (e.g. heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the control system 120 may be defined as electronics having various integrated circuits, logic, memory, and/or software that receive instructions, issue instructions, control operation, enable wafer processing operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g. software). Program instructions may be instructions communicated to the control system 120 in the form of various individual settings (or program files), defining operational parameters for carrying out a particular process on the wafer W within system 100. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The control system 120, in some implementations, may be a part of or coupled to a computer that is integrated with, coupled to the plasma processing system 100, or otherwise networked to the system 100, or a combination thereof. For example, the control system 120 may be in the "cloud" of all or a part of a fab host computer system, which can allow for remote access of the wafer processing. The computer may enable remote access to the system 100 to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to the system 100 over a network, which may include a local network or the Internet.

The remote computer may include a user interface that enables entry or programming of parameters and/or settings, which are then communicated to the system 100 from the remote computer. In some examples, the control system 120 receives instructions in the form of data, which specify parameters for each of the processing steps to be performed during one or more operations. It should be understood that the parameters may be specific to the type of process to be performed within the plasma processing system 100. Thus as described above, the control system 120 may be distributed, such as by comprising one or more discrete controllers that are networked together and working towards a common purpose, such as the processes and controls described herein. An example of a distributed controller for such purposes would be one or more integrated circuits on the plasma processing system 100 in communication with one or more integrated circuits located remotely (such as at the platform level or as part of a remote computer) that combine to control a process performed on the plasma processing system 100.

Without limitation, example systems that the control system 120 can interface with may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. As noted above, depending on the process step or steps to be performed by the tool, the control system 120 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Embodiments described herein may also be implemented in conjunction with various computer system configurations including hand-held hardware units, microprocessor systems, microprocessor-based or programmable consumer electronics, minicomputers, mainframe computers and the like. Embodiments described herein can also be implemented in conjunction with distributed computing environments where tasks are performed by remote processing hardware units that are linked through a network. It should be understood that the embodiments described herein, particularly those associated with the control system 120, can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g. a cloud of computing resources.

Various embodiments described herein can be implemented through process control instructions instantiated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

The invention claimed is:

1. A method for performing a plasma process in a chamber, comprising:
   supplying a process gas to the chamber;
   applying RF power to the process gas to generate a plasma in the chamber; and
   during the applying of the RF power, sequentially pulsing DC current through a plurality of concentric magnetic coils disposed over the chamber, to generate a radial magnetic field wave in the chamber,
   wherein sequentially pulsing the DC current includes synchronizing a frequency of the pulsing of the DC current provided to the plurality of concentric magnetic coils so as to pulse at a frequency of the RF power.

2. The method of claim 1, wherein the radial magnetic field wave sweeps radially outward from a center region of the chamber to a peripheral region of the chamber.

3. The method of claim 1, wherein sequentially pulsing DC current is defined by providing a DC current pulse to each of the magnetic coils consecutively in order, from an innermost magnetic coil to an outermost magnetic coil, with a time delay between initiating the DC current pulse to adjacent ones of the magnetic coils.

4. The method of claim 1, wherein the plurality of concentric magnetic coils are substantially oriented along a same plane.

5. The method of claim 1, wherein the sequentially pulsing DC current is cycled to repeatedly generate radial magnetic field waves in the chamber.

6. The method of claim 1, wherein the sequentially pulsing DC current through the plurality of concentric magnetic coils includes providing pulsed DC current to each of the magnetic coils by respective power supplies.

7. The method of claim 1, wherein the radial magnetic field wave reduces localized accumulation of charged species in the plasma.

8. The method of claim 7, wherein the reducing localized accumulation of charged species in the plasma further reduces non-uniformity of an etch process that is performed by the plasma.

9. The method of claim 1, wherein each cycle of the RF power is defined by a first state at a first power level and a second state at a second power level, wherein the second power level is less than the first power level.

10. The method of claim 9, wherein pulsing the DC current further includes synchronizing the DC current to the first state of the RF power,
wherein synchronizing includes substantially simultaneously initiating the DC current to the magnetic coil with initiation of the first state of the RF power, and substantially simultaneously terminating the DC current to the magnetic coil with termination of the first state of the RF power.

11. The method of claim 9, wherein pulsing the DC current further includes synchronizing the DC current to the second state of the RF power,
wherein synchronizing includes substantially simultaneously initiating the DC current to the magnetic coil with initiation of the second state of the RF power, and substantially simultaneously terminating the DC current to the magnetic coil with termination of the second state of the RF power.

* * * * *